(12) United States Patent
Chickermane et al.

(10) Patent No.: US 8,468,404 B1
(45) Date of Patent: Jun. 18, 2013

(54) METHOD AND SYSTEM FOR REDUCING SWITCHING ACTIVITY DURING SCAN-LOAD OPERATIONS

(75) Inventors: Vivek Chickermane, Ithaca, NY (US); Brion Keller, Binghamton, NY (US); Karishna Chakravadhanula, Vestal, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 369 days.

(21) Appl. No.: 12/823,586

(22) Filed: Jun. 25, 2010

(51) Int. Cl.
*G01R 31/28* (2006.01)

(52) U.S. Cl.
USPC ........... 714/729; 714/726; 714/727; 714/731; 714/742

(58) Field of Classification Search
USPC .................... 714/726, 727, 729, 731, 74
See application file for complete search history.

(56) References Cited

U.S. PATENT DOCUMENTS

| | | | | |
|---|---|---|---|---|
| 5,983,380 | A * | 11/1999 | Motika et al. | 714/733 |
| 6,327,687 | B1 * | 12/2001 | Rajski et al. | 714/738 |
| 6,480,072 | B1 * | 11/2002 | Walsh et al. | 331/78 |
| 6,611,933 | B1 * | 8/2003 | Koenemann et al. | 714/726 |
| 6,708,305 | B1 * | 3/2004 | Farnsworth et al. | 714/739 |
| 6,804,803 | B2 * | 10/2004 | Barnhart et al. | 714/738 |
| 7,000,130 | B2 * | 2/2006 | Adachi | 713/322 |
| 7,093,175 | B2 * | 8/2006 | Rajski et al. | 714/728 |
| 7,225,376 | B2 * | 5/2007 | Appinger et al. | 714/738 |
| 7,237,162 | B1 * | 6/2007 | Wohl et al. | 714/726 |
| 7,308,634 | B2 * | 12/2007 | Kiryu | 714/733 |
| 7,487,420 | B2 * | 2/2009 | Keller | 714/732 |
| 7,493,540 | B1 * | 2/2009 | Rajski et al. | 714/733 |
| 7,523,372 | B2 * | 4/2009 | Rajski et al. | 714/729 |
| 7,610,527 | B2 * | 10/2009 | Wang et al. | 714/724 |
| 7,610,539 | B2 * | 10/2009 | Balakrishnan et al. | 714/738 |
| 7,653,851 | B2 * | 1/2010 | Rajski et al. | 714/729 |
| 7,805,649 | B2 * | 9/2010 | Rajski et al. | 714/732 |
| 7,890,827 | B2 * | 2/2011 | Rajski et al. | 714/732 |
| 7,900,104 | B2 * | 3/2011 | Rajski et al. | 714/726 |
| 7,979,764 | B2 * | 7/2011 | Foutz et al. | 714/729 |

(Continued)

FOREIGN PATENT DOCUMENTS

EP 0481097 4/1992

OTHER PUBLICATIONS

Lin et al., A Unified Approach to Test Generation and Test Data Volume Reduction, 2006, IEEE, paper 18.2, pp. 1-10.*

(Continued)

*Primary Examiner* — John J Tabone, Jr.
(74) *Attorney, Agent, or Firm* — Dickstein Shapiro LLP

(57) ABSTRACT

A method and system for reducing switching activity of a spreader network during a scan-load operation is disclosed. According to one embodiment, a spreader network receives a plurality of scan input signals from a tester. A linear feedback shift register of the spread network is updated using the plurality of scan input signals. Each bit of the linear feedback shift register is shifted at each shift cycle for a plurality of shift cycles. The linear feedback shift register outputs a nonlinear gating signal using a first set of outputs and a data value feeding one or more scan chains of the spreader network using a second set of outputs. The pipeline clock of a pipeline element of the scan chains is gated using the nonlinear gating signal, and the data value is fed to the scan chains based on the pipeline clock. The scan chains are fed with updated values at the pipeline stage.

24 Claims, 12 Drawing Sheets

U.S. PATENT DOCUMENTS

| | | | |
|---|---|---|---|
| 8,166,359 B2 * | 4/2012 | Rajski et al. | 714/732 |
| 2004/0139377 A1 * | 7/2004 | Barnhart et al. | 714/726 |
| 2004/0230882 A1 * | 11/2004 | Huott et al. | 714/733 |
| 2006/0015787 A1 * | 1/2006 | Wang et al. | 714/726 |
| 2008/0235544 A1 * | 9/2008 | Lai et al. | 714/729 |
| 2009/0013227 A1 * | 1/2009 | Krishnakalin et al. | 714/728 |
| 2010/0137025 A1 * | 6/2010 | Tal et al. | 455/553.1 |
| 2010/0275077 A1 * | 10/2010 | Rajski et al. | 714/731 |
| 2011/0214026 A1 * | 9/2011 | Rajski et al. | 714/726 |

OTHER PUBLICATIONS

Lee et al., Combining Linear and Non-Linear Test Vector Compression Using Correlation-Based Rectangular Encoding, 2006, IEEE, pp. 1-6.*

Balakrishnan et al., Improving Encoding Efficiency for Linear Decompressors Using Scan Inversion, Oct. 26-28, 2004, IEEE, Paper 33.3, pp. 936-944.*

Ward et al., Using Statistical Transformations to Improve Compression for Linear Decompressors, 2005, IEEE, pp. 1-9.*

Bit-Flipping BIST, Hans-Joachim Wunderlich and Gundolf Kiefer, published in ICCAD '96, pp. 337-346, 1996.

Synthesis of Mapping Logic for Generating Transformed Pseudo-Random Patterns for BIST, N. A. Touba and E. J. McCluskey, published in 1995 International Test Conference, pp. 674-682.

LFSR-Coded Test Patterns for Scan Designs, Dr. Bernd Koenemann, published at 1991 European Test Conference, pp. 237-224.

Two-Dimensional Test Data Decompressor for Multiple Scan Designs, N. Zacharia et al., 1996 International Test Conference, pp. 186-194.

LFSR Reseeding as a Component of Board Level BIST, Pieter M. Trouborst, 1996 International Test Conference, pp. 58-96.

Scan Vector Compression/Decompression Using Statistical Coding, Abhijit Jas, et al., VTS '99, pp. 114-120.

Test Data Decompression for Multiple Scan Designs With Boundary Scan Rajski, et al. IEEE Transactions on Computers, vol. 47 Issue: 11, Nov. 1998 pp. 1188-1200.

* cited by examiner

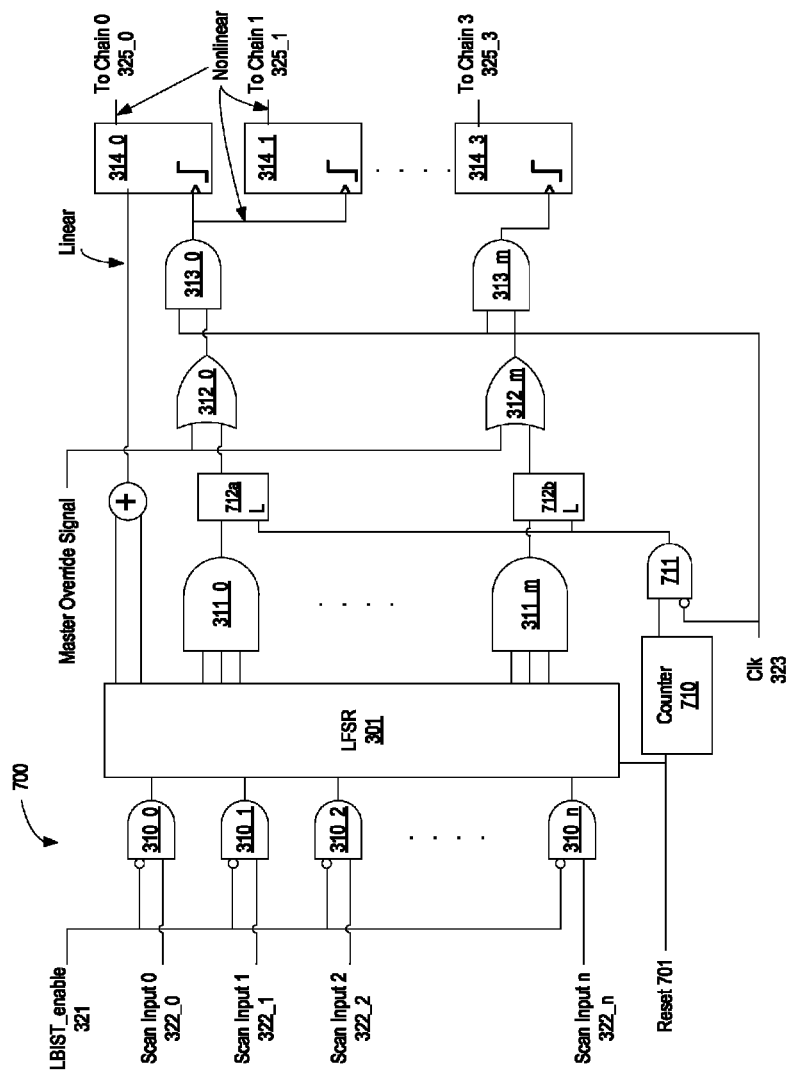

METHOD AND SYSTEM FOR REDUCING SWITCHING ACTIVITY DURING SCAN-LOAD OPERATIONS

FIELD

The field of the invention relates generally to testing of logic circuits and more particularly relates to a method and system for generating an efficient test pattern with reduced switching activity for a scan-load operation for a Logic Built-In Self Test (LBIST) or on-chip test decompression. The reduced switching activity avoids noise in the power rails of a circuit design and reduces excessive heat caused by higher switching rates.

BACKGROUND

As modern electronic devices become denser and operate on lower voltages than in the past, the circuits in those devices become more and more sensitive to simultaneous switching noise and heat caused by excessive switching. The simultaneous switching noise is caused by logic that switches states (from. 0 to 1 or from 1 to 0) and as they switch, the power signal is shorted to ground for a brief period of time. Because this switching period is very brief,—it is not of a great concern in a circuit design if just a small portion of the logic switches; however, for a very dense design with hundreds of millions or even billions of logic gates, the total effect of the switching is massive if a large number of these logic gates switch at nearly the same instance in time. The short-lived shorts from the power (Vdd signals) to the ground cause the ground signals in the circuit to be pulled up from the ground voltage toward the Vdd voltage (e.g., 0.8V up to 1.5V in most current chip technologies). Simultaneously, the $V_{dd}$ voltage tends to be pulled down toward the ground voltage. As the ground and $V_{dd}$ voltages move closer to each other, the circuits begin to fail. The fluctuation of the voltage between the $V_{dd}$ and ground signals is called "power rail noise" and is often referred to in the literatures as "simultaneous switching noise."

When simultaneous switching noise affects a logic design during a test, the test responses are neither predictable nor reliable. For example, a perfectly good device may appear to be failing a test because the switching activity is too high during the test. The yield may be very low and impact the profit margin for the device being manufactured.

In addition to simultaneous switching noise, high switching activity also generates excessive heat on the device. When more heat is generated than can be dissipated from the device during a given time period, a physical damage may occur to the device. Although both the power rail noise and heat are byproducts of excessively high switching activity within the device, the heat dissipation problem can be dealt with by slowing down the operational speed of the device so that the switching per unit of time is reduced. This reduces the power that is converted into heat per unit of time allowing more heat to be dissipated over time. Slowing down the operation of a device during a test may reduce the problem of overheating, but it creates other problems such as the elongated test time and/or not being able to test and stress the device at an operational speed. Because the cost of testing is usually in proportion to the amount of time the device is required to be in process on the automated test equipment (ATE), a longer test time translates into higher costs.

Certain techniques for compressing test patterns and applying them to scan chains with reduced data to save test time are known in the art. Prior art techniques compute a compressed test pattern using symbolic expressions associated with scan cells of an integrated circuit and solving a set of linear equations to obtain the compressed test patterns. The symbolic expressions are a linear function of input variables and are concurrently applied while loading the scan cells to address limitations such as seed-length limitations and mutually exclusive times for loading the seed. This prior art technique is useful for solving linear equations (e.g., XOR gates), however, is inadequate for solving equations that are not linear (AND or OR gates) or equations having inputs that are randomly or weightedly clocked. Furthermore, the decompressor is continually clocked to decompress the input variables such that the clock is gated for every scan cycle at each scan chain. However, if the linear equations are determined to be unsolvable for a certain scan cycle, the current test needs to be discarded and a new test must be restarted to apply new test patterns. This is a significant disadvantage.

Another prior art technique utilizes a real-time decoder for decompressing input test stimulus through a combinational or sequential logic linear decompressor. According to prior art test pattern decompression techniques, the output data from the decompressor is generally random and switches at a nominal 50% switching rate, significantly higher than functional switching rates that are typically between 5% and 25%. This translates directly into frequent switching of data values during scan cycles into the scan chains fed by the outputs of the decompressor. Resultantly, the frequent switching of data values generates noise in the power rails and causes excessive heat.

The present teachings described herein provide a method and system for reducing switching activity during scan testing of a logic design. The reduced switching applies during every scan clock cycle when loading new values into scan chains. The reduced switching helps at both reducing power supply noise as well as reducing heat/power dissipation.

SUMMARY

A method and system for reducing simultaneous switching noise and power consumption during scan shift cycles of an LBIST or sequential decompression of logic tests are disclosed. A sequential decompressor network contains a linear feedback shift register (also referred to as a Pseudo-Random Pattern Generator—PRPG) that receives data from a plurality of scan input signals and that sends its outputs through a linear spreader network. The linear spreader network includes a pipeline of one or more stages to ensure running at a high frequency. Test stimulus created within a typical LBIST network is configured similarly to that of a sequential decompressor except that the PRPG is not fed from scan input signals and that its next state is controlled only by its current state. The PRPG is normally implemented using a linear feedback shift register (LFSR) or a linear feedback finite state machine. Within a sequential decompressor, the linear feedback shift register (LFSR) is updated using the plurality of scan input signals as well as the linear feedback function of the LFSR. Each bit of the linear feedback shift register is shifted at each shift cycle of a plurality of shift cycles to load scan chains. The LFSR outputs are used to form a nonlinear gating signal using a first set of outputs and a data value feeding one or more scan chains of the spreader network using a second set of outputs. The pipeline clock of the final stage pipeline element of the spreader network is gated using the nonlinear gating signal, and the data value is fed to the scan chains through the final pipeline stage based on the pipeline clock. The current state of the bits within the linear feedback shift register is fed through the spreader network and its pipeline stage(s) to the scan chains. The data values being fed to the scan chains are linear combinations of the LFSR bits while the nonlinear gating signals are provided to controllably adjust the weight of the clock to the final stage of the pipeline.

To improve the speed of scan shifting through the spreader network, one or more pipeline stages are included between the LFSR and the outputs of the spreader network. According to one embodiment, a nonlinear, weighted gating function is applied to the clock of the final pipeline stage of the spreader network. The scan chains connected to the spreader network are fed with updated values at the pipeline stage. If the clock to the pipeline stage is gated on a shift cycle, the scan chains fed by such pipeline stages see the same data value as on the prior shift cycle—thus producing no switching activity on consecutive shift cycles. If the clock to the pipeline stage is not gated, the scan chains see the values from the linear spreader network. Due to the pseudo-randomness of value generation between 0 and 1, the new current have a 50% chance of switching to values that are different from the prior values output to those scan chains. By gating the clock to final pipeline stage elements with a signal weighted to gate off the clock for most shift cycles, most scan chains will see no changes to the input values on the majority of shift cycles, thus reducing the switching associated with the loading of new values into the scan chains.

The above and other preferred features described herein, including various novel details of implementation and combination of elements, will now be more particularly described with reference to the accompanying drawings and pointed out in the claims. It will be understood that the particular methods and circuits are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The accompanying drawings, which are included as part of the present specification, illustrate the presently preferred embodiment of the present invention and together with the general description given above and the detailed description of the preferred embodiment given below serve to explain and teach the principles of the present invention.

FIG. 7 illustrates an exemplary clock gating mechanism using a counter, according to one embodiment;

Figure 1:
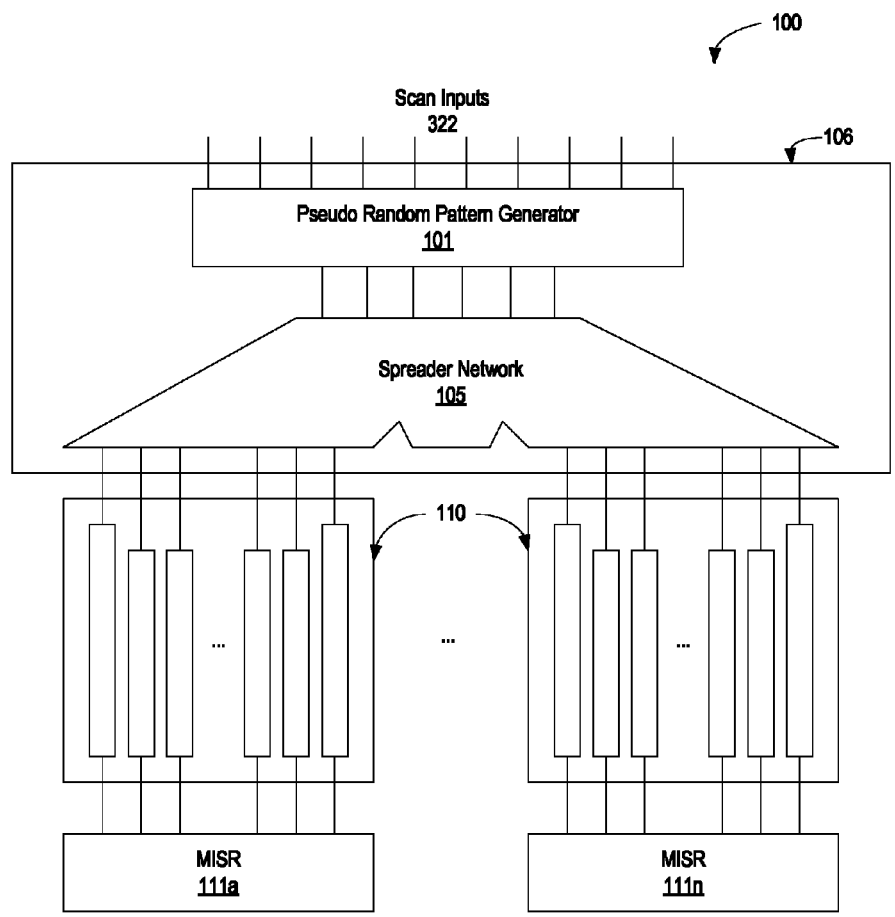
FIG. 1 illustrates a simple scan configuration typically used in the industry to apply a Logic BIST test to a digital circuit design, according to one embodiment.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not describe every aspect of the teachings disclosed herein and do not limit the scope of the claims.

DETAILED DESCRIPTION

A method and system for generating test data with reduced switching into scan chains fed from a pipelined spreader network for Logic BIST and/or sequential test decompression logic. According to one embodiment, a test decompression network receives a plurality of scan input signals from a tester. A linear feedback shift register of the test decompression network is updated using the plurality of scan input signals when not configured for use in an LBIST mode. Each bit of the linear feedback shift register is shifted at each shift cycle of a plurality of shift cycles. The current state the linear feedback shift register is fed into a spreader network that includes at least one pipeline stage before sending data into the scan chains; the last pipeline stage's clock for the spreader network is gated using a non-linear, weight function of the LFSR output so as to make the final pipeline stage not be clocked for most scan cycles. Scan chains connected to the spreader network outputs are fed with updated values from the pipeline stage only when the pipeline stage is clocked; when the pipeline stage is not clocked (most of the time), the chains are fed a repeat of the value they were fed on the previous shift cycle. The net result is that scan chains see mostly repeating values on consecutive shift cycles resulting in a significant reduction in switching activity during scan cycles while loading the next test.

Each of the features and teachings disclosed herein can be utilized separately or in conjunction with other features and teachings to provide a method for reducing the order of system models exploiting scarcity. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present invention. However, it will be apparent to one skilled in the art that these specific details are not required to practice the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems, design verification systems such as a hardware emulator, simulator, and hardware-accelerated simulator systems, or testers providing scan inputs to such design verification systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the invention as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The present teachings may be applied to LBIST or stored-pattern testing using on-chip sequential test decompression logic. These teachings may also be applied to combinational logic decompressors that are only applicable to stored pattern automatic test pattern generation (ATPG). Both LBIST and test compression are used heavily in the industry today.

Linear logic networks include solely exclusive-or (XOR), inverse of XOR (XNOR), or the combination of XOR and XNOR of their inputs. Non-linear logic networks are not restricted to use of only XOR and XNOR functions and may include any combination of AND, OR, NAND, NOR, XOR, XNOR, MUX, etc. and inverters.

In one embodiment, the present invention augments a decompressor with a non-linear function for gating the clocks of a final pipeline stage of the decompressor so as to greatly reduce the switching activity of the decompressor output data being fed into the scan chains. The reduction of the switching activity can be achieved for both purely random data driving the decompressor internal outputs, such as during a Logic Built-In Self Test (LBIST) mode of operation, or during a stimulus application to the inputs of the decompressor to obtain specific test results targeting specific fault detection, such as during compressed Automatic Test Pattern Generation (ATPG). Using the non-linear clock gating function of the decompressor, the compressed ATPG patterns and/or LBIST patterns are applied to the scan chains of the circuit with substantially reduced switching activity along the scan chains during loading of each test, thereby reducing the simultaneous switching noise that may appear on any one scan shift cycle and also reducing the power consumed and heat generated when applying scan shift cycles at a fast rate. The use of non-linear functions for gating of the clocks, in accordance with the present invention, is impractical for prior art techniques that assigns symbolic equations to each scan cell and maps data values that are to be shifted into the scan chains on each shift cycle back to decompressor inputs, to either gate the clocks off for some outputs to the scan chains or to gate the clocks on to ensure receiving of the data values that match the values needed by the chains of interest on each scan cycle. When equations are a linear function of inputs, it is simple to represent the equations since each input either contributes to one large XOR equation or not. When equations are a non-linear function of inputs, the equations are much more difficult and consume more storage to represent and process so that it is impractical due to the memory constraint and processing time to assign the non-linear equations to each scan bit position within each of the scan chains.

According to one embodiment, data switching activity during scan shift cycles is reduced by gating the clock to the pipeline stage elements feeding the outputs of a spreader network. The spreader network may be used as a part of a test decompressor function or as a part of a Logic BIST spreader. When the pipeline stage state element (e.g., flop) is not clocked, the prior value is output from the spreader network and loaded into the scan chain(s) without switching. When configured to run as test decompression logic, one or more scan-inputs may be utilized as clock gate override signals that force all or specific pipeline stage elements to be clocked on the next shift cycle. When all such scan-inputs are held to a value that does not override the clock gating, or when the logic is configured for an LBIST mode of operation (e.g., the LBIST_enable signal of FIGS. 3-9 is asserted), the clocks to the pipeline stage elements are gated with a weighted, pseudo-randomly generated gating signal such that the majority of spreader network outputs to the scan chains do not switch on the next shift cycle, thereby the data switching activity of the spreader network is reduced.

The clock to the pipeline stage is gated pseudo-randomly using one or more values output from the LFSR and ANDed together, unless overridden by a clock gate master or local override signal. By using more than one LFSR output values and ANDing them together, the clock gating signal is weighted towards gating off the clock more often than letting the clock through. Gating the clock with a single random value reduces the switching activity seen at the output of the pipeline stage by half. Each additional random value multiplies by another factor of half the probability of the pipeline clock getting through to the pipeline stage element. For example, a two-input AND gate provides a composite factor of $\frac{1}{4}$ ($\frac{1}{2}^2$) for the probability of the pipeline clock getting through; the pipeline stage element is clocked only when each input to the AND gate is randomly selected to be one. This AND clock gate combined with a $\frac{1}{2}$ probability for a new random value that is different from the one already in the pipeline stage, yields a probability of $\frac{1}{8}$ ($\frac{1}{2}^3$) for a switching value that appears at the pipeline stage output (See FIG. 3a). An un-gated pipeline clock means that the chance of a new value appearing at the pipeline output is $\frac{1}{2}$, which translates into 50% switching activity. If the pipeline clock is gated by a single random value, the probability to clock the pipeline stage is $\frac{1}{2}$. Another factor of $\frac{1}{2}$ is applied to account for the chance that the new value clocked into the pipeline stage element is different from the previous value to yield the 25% switching activity. For n LFSR outputs that are ANDed together to gate the pipeline clock, the formula for the probability of that pipeline stage element outputting a different value than what it currently holds is $\frac{1}{2}^{(n+1)}$ For example, suppose that the circuit under testing is designed to support at most 20% switching activity. While gating the pipeline clock Clk 323 with an AND gate of two LFSR outputs is acceptable—switching activity of about 1 in 8 or 12.5%, gating the pipeline clock Clk 323 with only one output of the LFSR results in switching activity of 1 in 4 or 25%, which is unacceptable for the design. Un-gating of the pipeline clock Clk 323 would result in 50% switching activity.

According to one embodiment, the final pipeline stages feed scan chains through additional XOR gates in the spreader logic without directly feeding them. When these XOR gates are fed from the final pipeline stages, the inputs to the scan chains are not switched if all the pipeline stages that feed that spreader output do not switch or if an even number of them switch (e.g., 0, 2, 4, . . . ) in which case the changes due to the switching cancel out (See FIG. 3b).

According to one embodiment, the pipeline clock gates to scan chains are overridden by a selected scan-input pin to force an update to the pipeline stages (FIGS. 3a and 3b) at the discretion of the test pattern generator. While generating test patterns, the ATPG prefers values on the scan-input pins that do not override clock gating so that the reduced switching is maintained. According to another embodiment, pipeline clock gates are overridden by different scan-input pins for different clock gates. One of the scan-input pins may be reserved as a master clock gate override (FIG. 4). It is noted that clock gate overrides do not apply when running in an LBIST mode of operation because the overriding is determined by the test pattern generator. During an LBIST mode of operation, all clock gating is applied using the weighted, pseudo-random values because there is no facility or need to override this clock gating.

According to one embodiment, the pipeline clock Clk 323 is gated using a decoding mechanism to ensure a fraction of the pipeline stages get clocked and updated. For example, a 1-of-4 decoder clocks only one out of every four pipeline elements (See FIG. 5). According to another embodiment, the pipeline clock Clk 323 is gated using a programmable number of random values from the LFSR to apply a variable weighting for the clock gating signal. For example, two programming bits and 4 different clock gate weights are applied: 1, 2, 3 or 4 random inputs are ANDed together, thus the switching activity is reduced from 50% by additional factors of $\frac{1}{2}$, $\frac{1}{4}$, $\frac{1}{8}$ or $\frac{1}{16}$ (See FIG. 6a). A slight modification to this embodiment uses two programming bits to select from 0 to 3 bits to weight the clock gate (See FIG. 6b). When 0 bits are used, the clock always gets through (i.e., the probability of the clock getting through is 1); when 1, 2 or 3 bits are programmed for weighting of the clock gate, the probability for the clock to get through is reduced to $\frac{1}{2}$, $\frac{1}{4}$, and $\frac{1}{8}$ respectively.

The programmable control bits for the clock gates are loaded prior to and independent of loading the normal scan chains, for example, via a side-scan mechanism. The side-scan mechanism provides a separate means to load control programming bits for testing without disturbing normal scan chains. The programmable control bits may be set differently on each test, or set once and reused for a subsequent test.

According to yet another embodiment, a programmable counter is used in the pipeline clock gating logic to sample and update the clock gate value each time the counter is reset (See FIG. 7). The counter is reset at the start of each tester-provided test or is reset at the start of the LBIST in a built-in-self-test. For example, a 4 bit down counter is used, and the pipeline clock gate signal updates once out of every 16 clock cycles. In this case, if the clock gate value gates off the pipeline clock (value is 0), the clock is gated off (for the pipeline stages so affected) for 16 consecutive cycles. If the clock gate is 1, the pipeline clock gets through for 16 consecutive cycles. The pipeline clock gate gets updated when the counter is reset (e.g., all the counter bits are zeros). A programmable counter is reset after the counter reaches its reset state; otherwise it cycles through to the all-ones state.

According to one embodiment, the data values being pipelined for an LBIST mode are weighted so that their tendency toward values of 0 or 1 is adjusted for any given scan chain. These values are held up in the pipeline stages to apply to one or more shift cycles (FIG. 9) if the pipeline clock Clk 323 gets gated off. In the example shown in FIG. 9, chain 1's pipelined data is flat random or weighted toward 0 or 1, depending on the values set on the two "weight select" control signals. The weight select signals are fixed once loaded into the control registers for a given set of LBIST cycles. The control registers may be loaded either during test mode initialization or could be updated using the side-scan mechanism described earlier. Other scan chains (e.g., chain 0, chain 3) may be fed by the same or similar weight select logic. There may be a number of independent weight select signals for controlling values feeding different groups of scan chains. In this case, the scan chain sets are weighted independently of each other. The programmable weighting of the data values using weight select control signals may be combined with the programmable weighting of the pipeline clock gate signal for LBIST. For example, scan chains receiving weighted data values tend to switch values less often even when the pipeline clock Clk 323 gets through, so they do not require gating off the pipeline clock Clk 323 as much as those scan chains that receive un-weighted data values.

Figure 10:
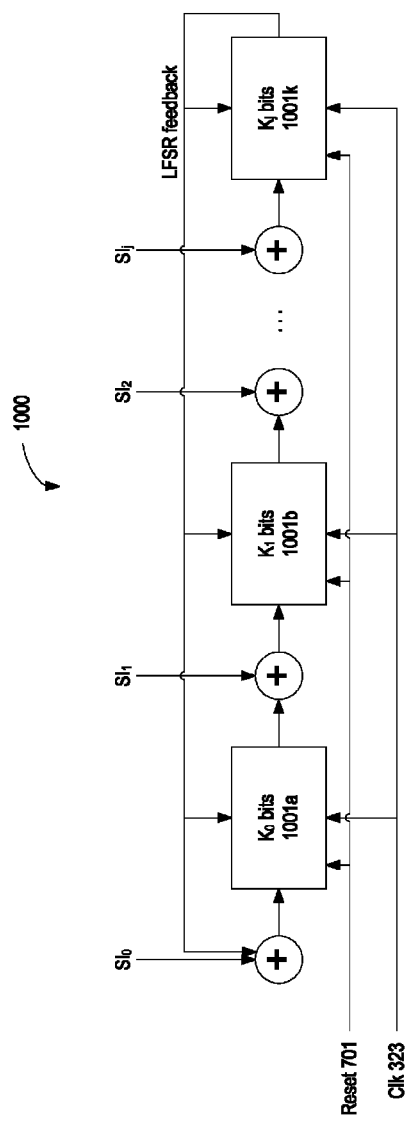
FIG. 10 illustrates an exemplary implementation for an LFSR for both LBIST and test decompression, according to one embodiment.

FIG. 10 illustrates an exemplary implementation of an LFSR, according to one embodiment. LFSR 1000 may be used in an LBIST mode or a test data decompression mode when connected to a spreader network.

Returning to FIG. 3*a*, LBIST_enable signal 321 is inverted and ANDed with each scan-input pin 322 prior to being XORed into the LFSR. When LBIST_enable 321 signal is set to 1 (See FIGS. 3*a*, 3*b*, 4, 5, 7, 8, 9), the spreader logic operates in an LBIST mode. In the LBIST mode, scan-input pins 322 are prevented from altering the operation of the LFSR state progression, thus scan-input pins 322 cannot override the data values that are being shifted into the scan chains. In such a configuration, LFSR 301 generates and outputs pseudo-random binary values on each shift cycle, and these values are fed to the pipeline stage elements. The pseudo-random gating of the pipeline clock Clk 323 reduces the switching activity for the LBIST scan data shifted into the scan chains. Once LFSR 301 is initialized, any counters set to a valid starting state, and all programming bits for the clock gating logic have been loaded, LFSR 301 applies the pseudo-random values to the spreader network. It may be useful to allow an LBIST controller to provide a clock gate override signal to force all spreader pipeline stage elements to update. Such a signal may be ORed with the master clock gate override signal shown in FIGS. 3-9 supplied from a scan-input pin. In this case, the LBIST controller updates pipeline stages to force out the data left there from the previous test pattern to ensure all data ending up in scan chains comes only from the current LBIST test pattern and not from a prior test pattern. This makes diagnostic processing more convenient to avoid having to go back one cycle more than necessary just to ensure the pipeline stage elements are set correctly.

Figure 9:
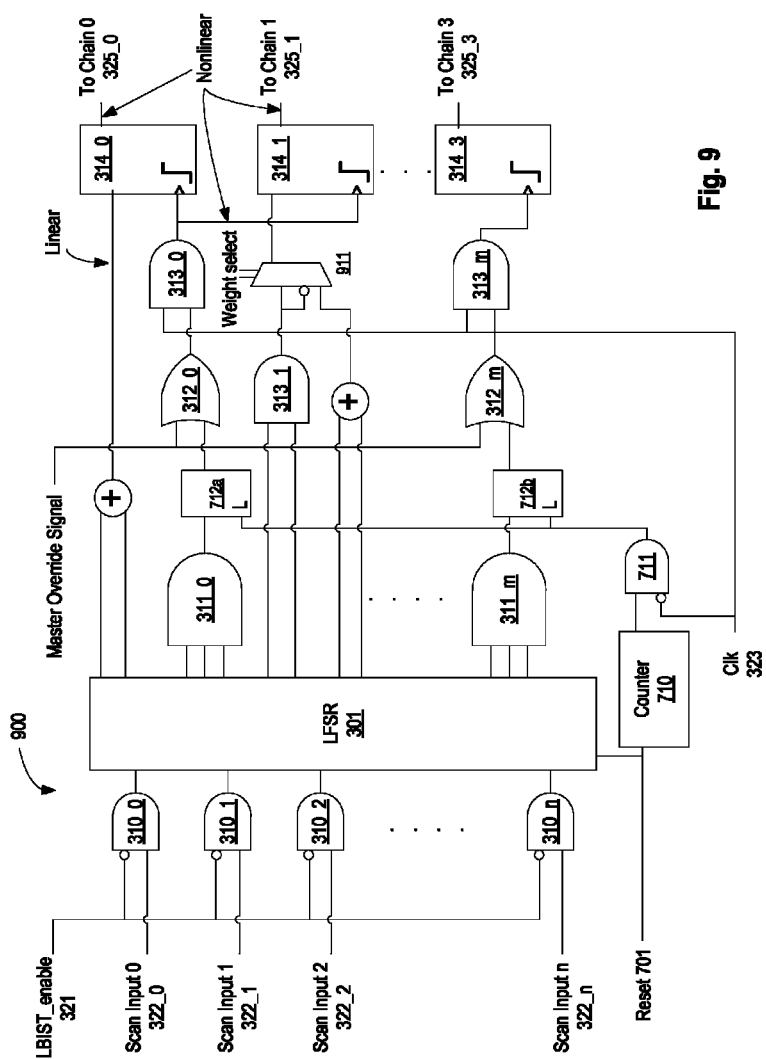
FIG. 9 illustrates an exemplary decompressor pipelining data with a weight select signal, according to one embodiment.

According to one embodiment, the pseudo-random outputs from LFSR 301 are switched at an even lower frequency due to the weighting on the pipeline clock gate signals applied for different sets of scan chains. From an LBIST signature calculation and fault simulation perspective, the logic values put into the spreader network affecting the pipeline data and clock are simply simulated to note what values are shifted into the scan chains. In one embodiment, the pipeline data is weighted based on one or more weight select signals (FIG. 9).

When the LBIST enable is set to 0 (See FIGS. 3*a*, 3*b*, 4, 5, 7, 8, 9), the values outputted to the spreader network pipeline are under control of the scan-input pins. This allows the scan-input pins to change the next state of the LFSR and also to control the clock gating overrides when necessary. This mode of operation is useful as a test data decompression mechanism for the stored (ATPG) test patterns. The scan-input data is XORed into separate bits of LFSR 301 as they shift with the applied clock (See FIG. 10). In a preferred embodiment, the bit positions within LFSR 301 where scan-in data is XORed are evenly distributed amongst all bits of the LFSR. The data path through the spreader network to its output pipeline stage may use linear logics (e.g., XOR gates) and/or weighted random (non-linear) logics, for example, weight select signals to controllably adjust the weight of the output data values (e.g., flat random, weighted toward 0 or weighted toward 1) into each chain (See FIG. 9).

According to one embodiment, a linear logic (e.g., XOR gate) is used to feed the output data in the spreader data path. The outputs fed to the scan chains are a linear combination of the values from the LFSR starting state (normally reset to a known state at the start of each test) and the data inputted from a tester into the circuit through scan-input pins 322. The advantage of such sequential decompressor design is that the values outputted from the spreader network lead to linear equations to determine the values to be sent into each scan chain. The difference between the sequential decompressor design and the present invention, however, is that the spreader network is pipelined, and the pipeline clock Clk 323 is gated by AND gates 313, including 313_0, 313_1, and 313__m, to the last stage of the spreader pipeline so that for the majority of shift cycles, most scan chains do not see their input values altered. By gating the pipeline clock Clk 323 to the last pipeline stage with values coming out of the LFSR 301 using AND gates 313, most scan chains receive no clock to the pipeline stage and see repeating test values at their inputs—thus reducing switching activity during scan shift cycles.

During a scan-in process, there are scan cycles when care bits are loaded via scan-input pins. If the prior value scanned into the chain matches the value intended for the next cycle for loading a care bit, the ATPG ensures either one of the following two conditions. The first condition is that the clock is gated off to the pipeline stage feeding this chain. This is probabilistically very likely because of the weighting on the clock gate signal, but can be assured by setting a single bit in the LFSR that controls the clock gate to be 0. If the first condition is not met, the second condition is that the data value at the input to the spreader pipeline for that chain matches the desired care-bit value that is changed or not. This second condition happens probabilistically (from random data) half the time, but can be assured by controlling values in LFSR 301 for that shift cycle. Again, when the next care bit for a scan chain matches the last bit shifted into that scan chain, either or both of the above conditions allow that next care bit to get loaded correctly.

During the scan-in process, if the prior value scanned into the chain is opposite to the value of the next care bit intended for that scan chain, the ATPG ensures that the clock is enabled to the spreader output pipeline stage, and the data value into that pipeline stage matches the care bit on that cycle. The clock gate is enabled either by setting values for all of the LFSR bits that are inputs to the clock gate or by overriding the clock gate by using specific scan-input pins that can override the clock gate(s) affecting the pipeline stage feeding that scan chain. The data value is set to the intended value by setting the bits in LFSR 301 that are linearly combined to generate that chain's input data or non-linearly combined when weighted data values are being generated.

According to one embodiment, the pipeline clock Clk 323 is gated using any combination of the previously mentioned methods. The clock gate may be overridden by a selected value on a single scan-input pin using OR gates 312, including OR gate 312_0 and OR gate 312__m (See FIGS. 3*a* and 3*b*). A clock gate override ensures that a new care bit is loaded into chains on the next cycle.

According to one embodiment, the clock override comes from different scan-input pins for different spreader output pipeline stages using OR gates 312, including OR gate 312_0 and OR gate 312__m (FIG. 4). This provides flexibility for overriding the clock gates for different scan chains without using the same scan-input pin.

Figure 8:
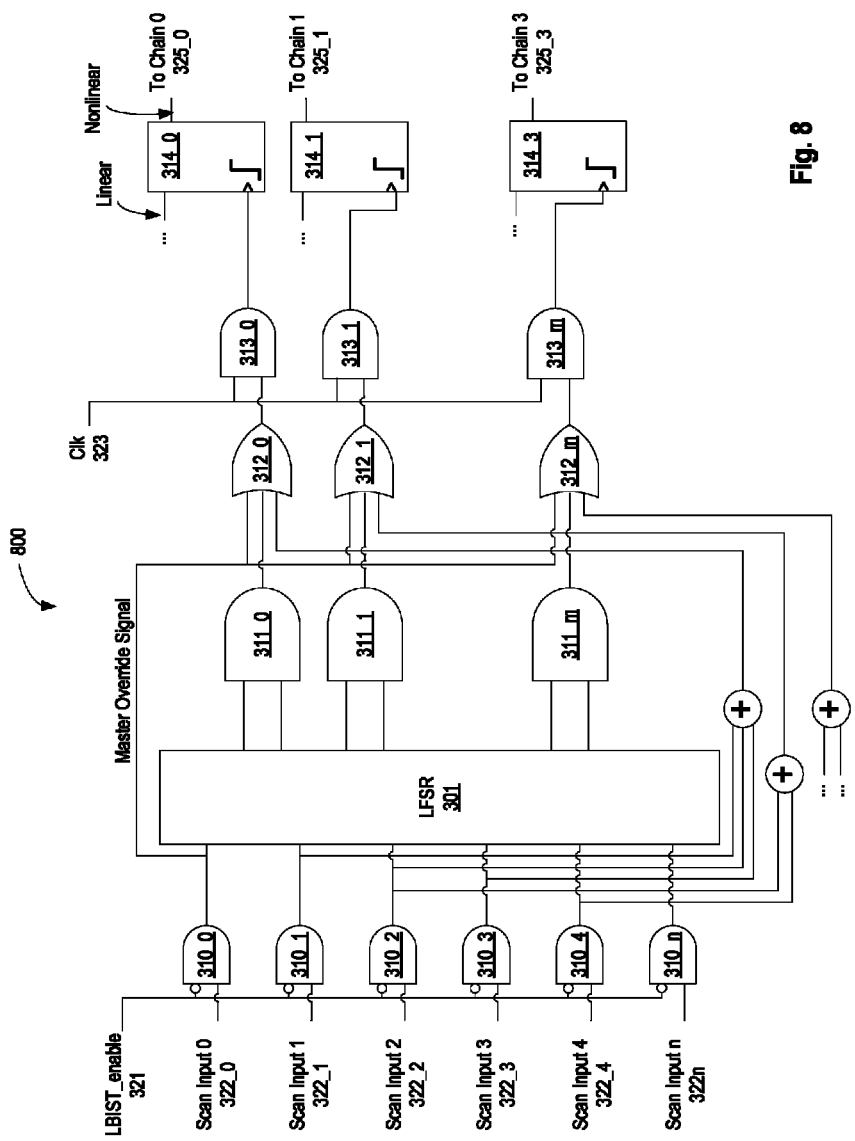
FIG. 8 illustrates an exemplary decompressor with a single scan input used as a master clock gate override and linearly combined scan-inputs used to override individual clock gates, according to one embodiment.

According to one embodiment, each spreader pipeline clock gate is overridden by a linear combination of scan-input pins and a single master override (FIG. 8).

According to one embodiment, when the pipeline stages in the spreader network are placed in the physical design, the operating speed of the spreader data path from the LFSR through the pipeline stages to the scan chains is optimized. The scan cycle operation may be sped up, and resultantly the reduced scan switching allows a higher scan cycle rate without a risk of overheating the circuit under test.

For decompressing test data, the LFSR and the counters are reset prior to loading the scan data for each test. After a reset, several scan cycles are applied to sufficiently shift the LFSR from the reset state so that specific LFSR outputs are directed to values for loading care bits. For example, the LFSR is shifted k+1 bits or more, where k is the largest $k_i$, within the LFSR (FIG. 10). For example, the LFSR is 64-bit long with 8 scan-input signals and 8 LFSR stages between points where the scan-input signals are input to the LFSR. This suggests use of 8 cycles to fully initialize the LFSR plus one more cycle for each spreader network pipeline stage so that the final pipeline output is explicitly set by the ATPG if needed to load a value into the end of the longest scan chain. During the initialization phase of shift cycles, the pipeline clock Clk 323 is overridden sufficiently to ensure that the pipeline is cleaned and does not contain values left from a prior test. This removes the dependence of values from one test to the next and prepares the spreader logic for the next test. During an LBIST mode, the LBIST controller supplies the clock gate override signal at the beginning of each new LBIST scan event to load in the next test and unload the prior test's results so as to keep each LBIST test independent of the data left behind in the pipeline from the prior test.

Once the initialization of shift cycles is completed, the subsequent shift cycles output values into the scan chains that will stay within the longest scan chain(s). The number of scan cycles applied from here forward is based on the length of the longest scan chain. For example, if the longest chain is 1000 bits long, and the initialization phase adds 8 scan cycles, the total scan cycles needed to load in one test would be 1008 scan cycles.

On each of the scan cycles applied to the circuit, the LFSR departs from its current state and takes on values within its bit positions based on the values being shifted in on each scan-input pin and on the feedback operation of the LFSR. This shift operation may be computed in advance based on the linear feedback function of LFSR 301 and the linear inclusion (e.g., XORing) of the scan-in data into specific bit positions within the LFSR. This results in linear equations of up to n*m variables for each LFSR bit that represents the values in those LFSR bits after n shift cycles each of which brings in m new values from m scan-input pins. These linear equations are based on a recurrence relationship of the LFSR feedback and the scan-input pin XORing into the LFSR such that the LFSR bits are a linear function of the initial state and the m scan-input pin data values for each shift cycle applied during the n shift cycles. Equations only for each LFSR bit are stored as a function of the scan-in stream data and the initial state of the LFSR. Assuming a reset state of all zeros for simplicity, the reset state of the LFSR allows those values to drop out of the equations and LFSR state equations that are a function only of the scan-input pin data stream values are left, to which variable names for scan-input pins 1 through m are assigned as vectors, for example, $SI_1[1-n]$, $SI_2[1-n]$, ..., $SI_m[1-n]$ represent the values for scan-input pins 1 through m for scan cycles 1 through n. Note that some of these variables may be constant values that are the same on all tests, such as the value on the master clock gate override scan-input during the first few shift cycles to force the pipeline to be cleaned out.

After initializing the test patterns in LFSR 301 to produce a test, the automatic test pattern generation (ATPG) software examines the care bits needed to target one or more faults as they need to appear at the spreader outputs to shift into the appropriate scan chains. The test patterns provided by the ATPG for the test may target a specific type of fault. Once care bits and their positions have been identified for the test, ATPG fills the scan-input pins' stream of data with values that force the care bits to appear at the spreader network outputs so they shift into their proper positions within the scan chains. Don't-care bits refer to those bits within the scan chains that are not needed to be at any specific value to detect the set of target faults that the ATPG intends to detect for the specific test. Don't-care bits are provided to appear in a pseudo-random fashion by not paying any special attention to them. The compression rate of the test pattern set depends on the care bit density, typically 2% or less within the internal scan chains on each test. The low care bit density means that the vast majority of bits loaded into scan chains are don't-care bits that will be provided pseudo-randomly. Without use of a reduced switching mechanism described herein, most don't-care bits appear randomly 0 half the time and 1 half the time, which produces approximately 50% switching during scan cycles. The reduced scan switching mechanism according to the present teachings provides pseudo-random values for don't-care bits, still 0 half of the time and 1 half of the time, but that are repeated within consecutive scan bits of the same chain in most scan cycles so as to reduce the scan switching activity.

According to one embodiment, the ATPG process places care bits for testing one or more faults per test. During this process, the ATPG provides appropriate values at the spreader network outputs (which are also scan chain inputs) to place the care bits into the scan chains on the intended shift cycles so they are placed in their correct positions within their scan chains. Because of the sequential dependency between scan cycles due to the clock gating on the final pipeline stage and the sequential nature of the LFSR's feedback; the ATPG needs to resolve the scan-in data stream to place the correct values at the scan chain inputs on each scan cycle. The ATPG first processes the care bits that will end up farthest away from the scan chain inputs (i.e., those bits closest to the ends of the longest chains) that have to be loaded into the scan stream first. The remaining care bits closer to the scan chain inputs are loaded in successive passes. The passes for solving this transition problem may be done one shift cycle at a time for each shift cycle containing care bits to be loaded into one or more chains. Alternatively, it may be segmented into stages to solve up to c shift cycles per pass starting with the first shift cycle that needs to send care bits into at least one of the scan chains. By solving earlier shift cycles first, the values in the spreader pipeline are known, allowing the ATPG to decide whether to override the clock gating or not for the following cycles depending on care bit requirements. When there are scan cycles with no care bit requirements, the assignment of values to scan-input pins for those cycles on up to the next cycle with care bits to be loaded can be postponed, allowing more input variables to be included in the equations for the LFSR bits to be used to provide the care bits on the next cycle that contains some. More variables in the equations generally imply that it will be easier to solve the equations to meet these care bit requirements.

Each shift cycle with care bits is solved one at a time from the earliest shift cycle with care bits to the last shift cycle with care bits, so that the ATPG process focuses on solving just the scan cycle of interest. For the very first scan cycle with care bits in it, it is ensured that the clock to each chain needing a value in that cycle has been allowed through either on that shift cycle or a previous cycle. According to one embodiment, the first cycle is chosen to use the clock gate override or the LFSR data based on scan-in data that sets all LFSR bits to enable the clock to that chain's pipeline. If the LFSR bits are chosen to enable the pipeline clock Clk 323, the bits of the scan-in stream that have been XORed together up to that cycle are identified to define the values that are in the LFSR bits at that time. These are linear equations of the scan-in bit streams, and all clock gate inputs are solved to be at the enabling state for the scan chains of interest. If this is not solvable, the clock gate override is used to allow some or all pipelined data streams to update using one or more of the scan-in stream values for the next scan cycle, having also an influence on the next state of the LFSR. In addition, the linear equations are solved for the data values to shift through the pipeline so they appear at the scan chain inputs that need those care bits on that cycle. Solving the clock gating and data value equations simultaneously, the values for the scan-in streams on various scan-input pins are determined. This may fully specify all scan-input pin values for cycles up to this one, or may leave some scan-input pin values yet unspecified, allowing the ATPG to utilize them in subsequent scan cycles to provide other care bits. It is noted that LFSR bits used for data values are needed p cycles earlier than the cycle needing the values to be output from the spreader for a pipeline depth of p and LFSR bit values used for the clock gating of the last stage of the pipeline need to be set 1 cycle earlier; any clock gate override scan-input pins used come from this shift cycle and not an earlier one. Also it is noted that when ATPG intentionally gates off the pipeline clock Clk 323 to a pipeline element, it sets at least one LFSR bit to the correct gating value and ensures that any clock gate overrides are held off, since those could fowl up use of the clock gate.

Once the first shift cycle containing a first set of care bits has been solved, the next shift cycle with the next set of care bits is considered. The equations for this cycle are solved by taking into consideration the values that are left in the spreader pipeline from the solving of the prior care bit shift cycles. For example, if the previous shift cycle left a value of 0 in the pipelined data feeding to chain j and a value of 0 needs to be fed to chain j on this cycle, either the equations to gate off the pipeline clock are solved, or the value 0 is obtained through the data path. To gate off the pipeline clock Clk 323, since multiple LFSR bits are ANDed to create the clock gate, at most one of these bits of the LFSR is set to 0 to gate off the clock. Even though setting a single LFSR bit to 0 is easy to do, if that turns out not so simple due to other care bit solving requirements, the value is obtained using the pipelined data path since the pipeline clock Clk 323 gets through. This requires one or more LFSR bits to be set, depending on the XOR function of the spreader network feeding to that scan chain and spreader network output. The LFSR bit values are translated from those bits to the scan-input pin stream values needed to set those LFSR bits at that cycle by solving the equations for those LFSR bits on those cycles and knowing the values set on scan-input variables from prior cycles. As the values for each scan cycle are solved, more of the scan-in stream bit values become known in order to determine the care bit values loaded into each scan chain. Later shift cycles are processed with the next set of care bits to continue resolving the translation of internal chain care bits to scan-input pin stream values.

Solving scan cycles one at a time is convenient for describing the basic process of translating the care bit requirements back into the scan-input pin streams that represent the compressed scan data for a test. However, one down side of solving one scan cycle at a time is that solving care bits on a cycle may be done many different ways, and the solution selected for that cycle might cause a problem solving a later cycle because of the values chosen to be set on the scan-input pins. A more complex process may achieve a better result by solving two or more consecutive scan cycles at one time while the solution may fail to be translated when examining just one scan cycle at a time.

To examine translating care bits to scan-input stream values on multiple consecutive scan cycles, the current cycle and the following cycles are examined until a lull in care bits is discovered or a limit is reached for the number of consecutive scan cycles to process in one pass. The first cycle of the set of c consecutive cycles is translated, and the information about what choices were made is saved so that the search for a solution on this scan cycle can be revisited at a later time if a problem arises for solving one of the later cycles in the set of c cycles being examined. First, the clock gating is solved because the time when the scan data must change on consecutive scan cycles is easily identifiable so that the scan cycles that the pipeline clock Clk 323 has to get through are known. If an attempt to get the clock ON for those cycles by LFSR bit values fails, a future scan-in stream data value is used for a clock gate override. The decision is saved on a decision stack unless there were no decisions and there remain no choices for how to get the clock ON in those cycles. The data values for all the cycles are examined within this set to determine when the pipeline clock Clk 323 is turned on (consecutive cycles with opposite data values going into the same chain). The decisions are saved on the decision stack in case such decisions have to be revisited at a later time. If the prior bit matches, the clock on a cycle backward from the first cycle to the last in the set of the c cycles is gated to get any care bit value. If there is no care bit for a chain on the current cycle, but there is a care bit for that scan chain on a future cycle and it is different from the current value for that scan chain (in the pipeline element feeding it), the pipeline for that scan chain can be clocked on any cycle between now and the cycle the care bit is needed. However, once it is clocked, the data value is loaded on that cycle as well and then the clock is gated off on future cycles until reaching to that next care bit cycle for that scan chain. Because the pipeline is clocked on the intended cycle or one or two cycles prior to that, the decisions are made in that order to obtain that next care bit for the scan chain. If any of them runs into a conflict to load the value on that cycle, the decision is revisited via the decision stack to load the value one cycle earlier and then hold off the clock on the intervening cycles. It is noted that if the loading of the care bit on the intended cycle fails, it is returned to the prior cycle with new requirements and the prior cycle is solved again. If that also fails, the new requirements are pushed back into the cycle before that one and that yet earlier cycle is solved again. Because it is undesirable that care bit requirements are pushed back too many cycles, this backing up process may be limited to some modest number of cycles, for example 4. At some point, it is easier to force the data pipeline to be clocked using a clock gate override signal later rather than earlier and then have to keep forcing the clock to be gated off.

If a set of scan cycles are solved part of the way through and run into a conflict that is not solvable given the decisions previously made, a previous decision is revisited to try a different way to get the care bit values and proceed again. After different trials, if there are no further choices to be made, that decision is not saved on the decision stack. When an empty stack is reached, it is determined that there is no solution for translating the care bits to scan-input pin streams for this set of scan cycles.

If the end of a set of c consecutive scan cycles is reached in one pass and it is resolved how the scan-in streams are set to load the care bits as needed, this information is saved as a given up to that last scan cycle included in that set. Later shift cycles are examined for more care bits and a set of consecutive cycles are collected to solve together. If the next scan cycle with a care bit in it is several cycles away (for example, 4 or more cycles), it is moved on to the next care bit cycle ignoring what values are left in the pipelines, requiring the ATPG to load the desired values into the pipeline as is done for the earliest care bit cycles. This allows cycling more scan-input stream variables into the LFSR to solve a set of equations for the LFSR bits at the expense of not being able to use the clock gating to hold onto values already in the pipeline.

The ATPG process produces only the test patterns that are successfully translated into scan-input pin streams. According to one embodiment, a maximum of 8, 16, or 32 cycles is solved together to avoid a potentially large stack of decisions to be able work back through if there is a conflict in solving the cycles together. If all care bits are not successfully translated into scan-input pin stream values, the set of care bits under consideration is not solved, and the ATPG tries a different set of test patterns. If the ATPG fails to solve the decompression process for care bits while merging more care bits for additional fault targeting, the ATPG abandons the attempt to merge and tries a different set of care bits for merging. It is possible, although considered rare and unlikely, that the care bits for detecting a single, specific fault may not be solved correctly. In this case, that fault cannot be detected using the test compression logic. Such a fault may still be detected by accident or unexpectedly. Otherwise, it may be targeted using a non-compression test mode or it may be left untested.

Regardless of the set size of the scan cycles chosen for solving, once they are solved, most of the scan-input pin stream data shifted into the LFSR by the last cycle of that set will have been set and many of the pipeline stages are at known values. The scan-input pins not yet set from prior cycles are left unset if they are from relatively recent scan cycles since they are utilized to solve future care bit values. However, if the scan-in data is from more than a few cycles back, they are set to a value now so that when solving the next set of scan cycles, the equations in use involve just the scan-input pin stream values from those cycles and a handful (e.g., 32) of earlier cycles. This allows for the use of a set of linear equations for LFSR bit values that contain only a few thousand scan-in stream variables at most and likely only a few hundred variables to represent their values. It is noted that the linear equations that contain variables to represent the values collapse to smaller and simpler equations when those variables are replaced with constant values (e.g., 0 or 1) for the solved values up to then. All variables in a linear equation that are replaced with constant values are reduced to a single constant (e.g., 0 or 1) to represent the XOR of all of those constant values. For a typical implementation, the linear equations are solved for obtaining the LFSR bit values containing a few tens to a few hundred variables. For example, if there are 8 scan-input pins and a set of 32 scan cycles is solved at a time allowing that at most the previous 32 scan cycles of data may be left unspecified, there are at most 64 cycles of 8 scan-input pins of data for a total maximum of 512 input variables to consider while solving the linear equations representing the LFSR bit values for those scan cycles. For any scan cycles with unspecified scan-input values that are more than 32 cycles earlier than the set of cycles currently to be solved, those scan-input pins are set to a default value of 0. In a preferred embodiment, a default value of 0 is chosen for such don't-care scan-input pin values because that value is known to not override any pipeline clock gating.

According to one embodiment, a counter gates the pipeline clock gating latches. The clock gating signal that is a function of some number of LFSR bits is sampled every so many shift cycles based on when the counter reaches all zeros. It is advantageous for the ATPG to use the LFSR bits to enable the clock gate on a cycle in which the counter samples and latches the gating value prior to a scan cycle that needs to send new values out of the spreader network to specific scan chains. It can then utilize the fact that those pipelines update for the next cnt cycles (where cnt is the number of cycles between when the counter allows another clock gate update sample to be made, normally $2^n$, n being the number of bits in the counter), meaning that for those cycles the ATPG only needs to ensure the spreader data values match the needed care bits. The processing enables the clock gating on a cycle within cnt cycles prior to the necessary care bits being loaded in the scan chain that matches when the counter cycles. Use of a counter reduces the number of scan cycles that the ATPG needs to solve the non-linear clock gating equations for when there are several consecutive scan cycles requiring care bits for the same scan chain. The counter is also useful for LBIST pattern application by allowing those chains currently selected to enable their pipeline clock Clk 323 to receive potentially non-repeating values on cnt consecutive cycles. This helps to detect faults that may require some amount of non-repeated values on consecutive scan cycles.

According to one embodiment, decompressor programming and configuration bits are used to determine the number of bits being ANDed for clock gating. The ATPG determines which scan chains have care bits to be loaded and weights the clock gating to the maximum for those scan chains that need few or no care bits. For relatively few scan chains with a fair amount of care bits, the ATPG minimizes the clock gate weighting to make it easier to load new values into those scan chains. Additional analysis takes into account the frequency with which the care bits change their values so that the scan chains with a fair number of care bits that do not change their values often also have their clock gate weighting kept high—only those scan chains with many care bit value changes have their clock gate weighting reduced prior to loading the scan data. The number of bits needing to be loaded for programming the clock gating logic is kept low by sharing the clock gating logic across many spreader network outputs.

A logic BIST (LBIST) pattern generator provides scan data via a linear feedback shift register (LFSR). The LFSR feeds the scan data into a spreading network and to one or more scan chains by pipelining the spreader network. At the last stage of the pipeline, the clock is gated to update scan data values during some shift cycles and hold their prior values during other shift cycles, with most shift cycles not updating the values for most scan chains.

According to one embodiment, the clock to the final pipeline stage is gated by a weighted-random value that is ANDed with one or more bits from the LFSR. The more bits that are ANDed together, the lower the probability is that the clock is enabled and the higher the probability is that the scan chains fed by the pipeline stage see repeating values.

According to one embodiment, a clock gating logic used for one pipeline element is shared with other pipeline elements feeding different outputs of the spreader network. This reduces the overhead of the clock gating logic. In another embodiment, each final pipeline stage element has its own, independent clock gating logic.

According to one embodiment, the clock gating logic to a set of different pipeline stage elements is driven from a decoder that decodes the LFSR bits to ensure enabling of the clock to only one pipeline element in the set sharing the decoded LFSR bits. In such cases, only use of a clock gate override signal can allow more than one of the pipeline elements in the same set to get updated in the same shift cycle.

According to one embodiment, the clock to the final pipeline stage is gated by a clock gating signal that is sampled at a frequency set by a counter. Depending on the size of the counter, the clock gating logic to the spreader network in the last pipeline stage updates every cnt shift cycles, where cnt is a power of 2 (i.e., $2^n$ wherein is the size of the counter in bits). For example, using a 4 bit counter, the clock gate pipeline updates once every 16 shift cycles. This means that for 16 consecutive shift cycles, the pipeline output either updates on every one of the 16 cycles or holds its value for all 16 cycles. A programmable counter may be used to allow count values that are not a power of 2.

According to one embodiment, when the LFSR and the spreader network are used for decompressing a stored ATPG test pattern, the LFSR next state is altered by XORing the scan-input pin values into evenly distributed bits of the LFSR and one or more scan-input pin values can override the clock gating of the pipeline to force the clock to be enabled. The clock gating override handles cases where the care bit density is high enough that several scan chains are enabled to shift in new data at the same time. Otherwise, the scan-input pin data needs to be set appropriately to ensure the LFSR bits gating the clock are set appropriately to enable the clock to get through. This may be acceptable when a single scan chain changes its input value, but when several scan chains require changes on their inputs, it is useful to bypass all clock gating of the pipelines, unless those chains share the same gated pipeline clock.

According to one embodiment, particularly for use with test decompression, the LFSR outputs that are ANDed together to form a clock gate signal are consecutive bits of the LFSR without a scan-input pin XORed between them. Once all such bits are a logic 1 that enables the clock, all but 1 of these logic 1 values shift and they are still input to the AND gate, leaving only 1 new value to be set (via scan-input pin) to continue enabling the pipeline clock Clk 323 for additional shift cycles. This allows for more chance to use the LFSR bits to enable the clock rather than heavily relying on the override mechanism.

In another embodiment, the clock gating to different pipeline stages is overridden by different linear (XOR) combinations of scan-input pins. All clock gates may be overridden with a master override scan-input pin. For all scan-input pins used for clock gate overrides, they receive default values of 0 when those inputs are not required to be set, and they receive a preferred value of 0 during equation solving when there may be multiple solutions available for solving the equations—especially for any master clock gate override signal—to ensure most chains are receiving repeating values to keep switching activity low.

In yet another embodiment, the master clock gate override for all or a large number of the pipeline stages is derived by a logic function (e.g., a 6 input AND gate ORed with a normal clock gate signal) of LFSR outputs. This provides a means to force all or many chains to get new data on their inputs using LFSR bits instead of a scan-input pin for overriding the clock gating.

FIG. 1 illustrates a simple scan configuration used to apply a logic BIST test to a digital circuit design, according to one embodiment. This is a standard STUMPS (Self-Test Using MISRs and PRPGs) configuration that is commonly used in the industry and made popular by IBM in the early 1980's. It is noted that the LFSR for configuring an LBIST is exchangeably labeled as a Pseudo-Random Pattern Generator (PRPG). Decompressor 106 includes Pseudo random pattern generator (PRPG) 101 and LFSR feeds spreader network 105 (exchangeably referred to as a space expander, or a phase shifter) that feeds scan chains 110 connected thereto. Scan chains 110 feed to one or more multiple input signature registers 111 (MISRs) to compress and save the test results after a test is run. There may optionally be a space compactor between scan chains 110 and MISRs 111 (not shown) to reduce the number of bits needed for implementing the MISR(s).

Figure 2:
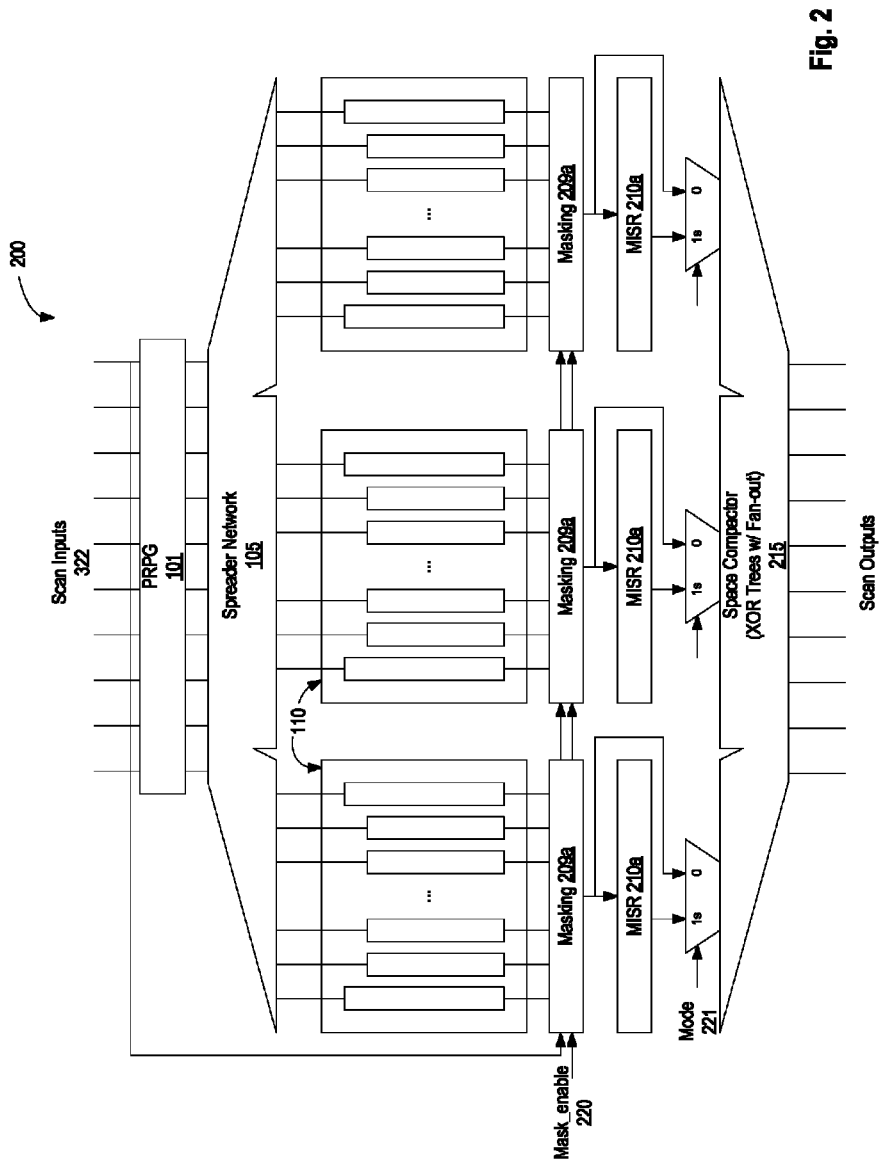
FIG. 2 illustrates an exemplary sequential test compression diagram for applying compressed test inputs to a digital circuit design, according to one embodiment.

FIG. 2 illustrates an exemplary sequential test compression diagram for applying compressed test inputs, according to one embodiment. Scan-input pins 322 feed into PRPG 101 incorporating an LFSR that feeds spreading network 105. Spreading network 105 feeds scan chains 110 that in turn feed the compression logic including MISRs 210 and/or space compactor 215 that feed to design outputs used to either observe the MISRs or as scan-output pins when bypassing the MISRs. Mode signal 221 sets the test mode allowing MISRs 210 to be bypassed for a portion of the test patterns to aid diagnosis of failures detected by the test.

The sequential decompression is provided by PRPG 101 acting like a MISR in that it receives multiple scan-in streams and outputs new states to spreader network 105 that feeds values to multiple scan chains 110. For simplicity, any reset function used to reset PRPG 101 to a known starting state is omitted from the diagram.

Spreading network 105 adds a pipeline stage on the path from PRPG 101 to scan chains 110 or re-purposes the last pipeline stage in the existing spreading network 105 and uses clock gating on the clock to the last stage of pipeline to force scan chains 110 to receive a repeating value and thus reduce the switching activity along scan chains 110 during LBIST or test compression operation.

Figure 3A:
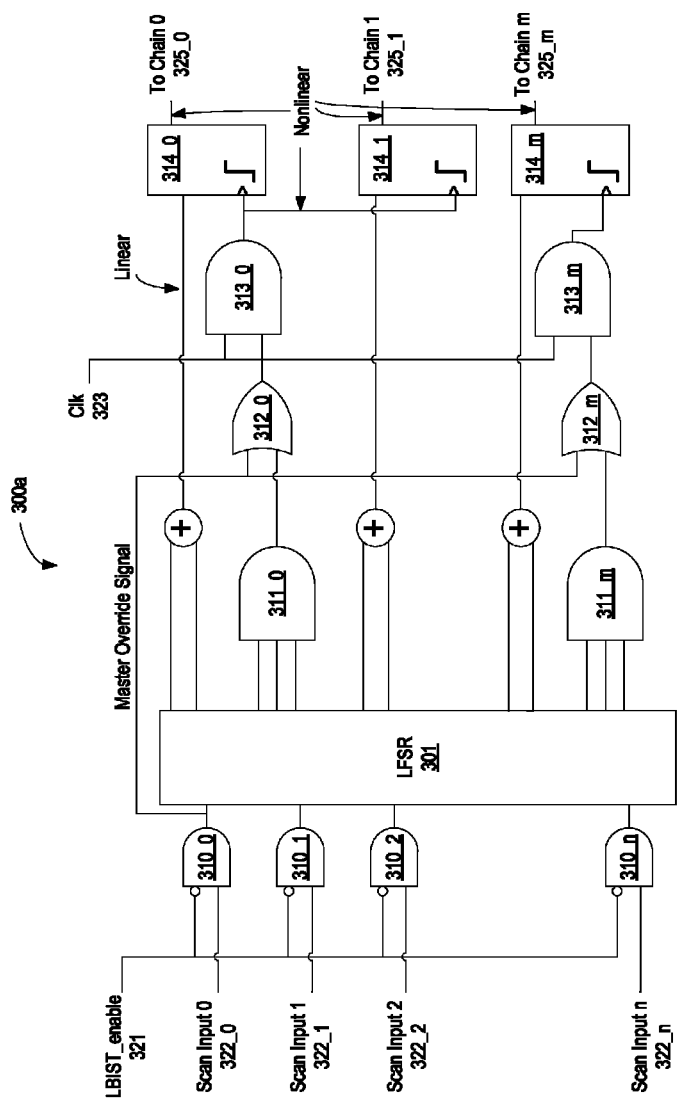
FIG. 3a illustrates an exemplary sequential decompressor with a final output pipeline stage within a spreader network, according to one embodiment.
Figure 4:
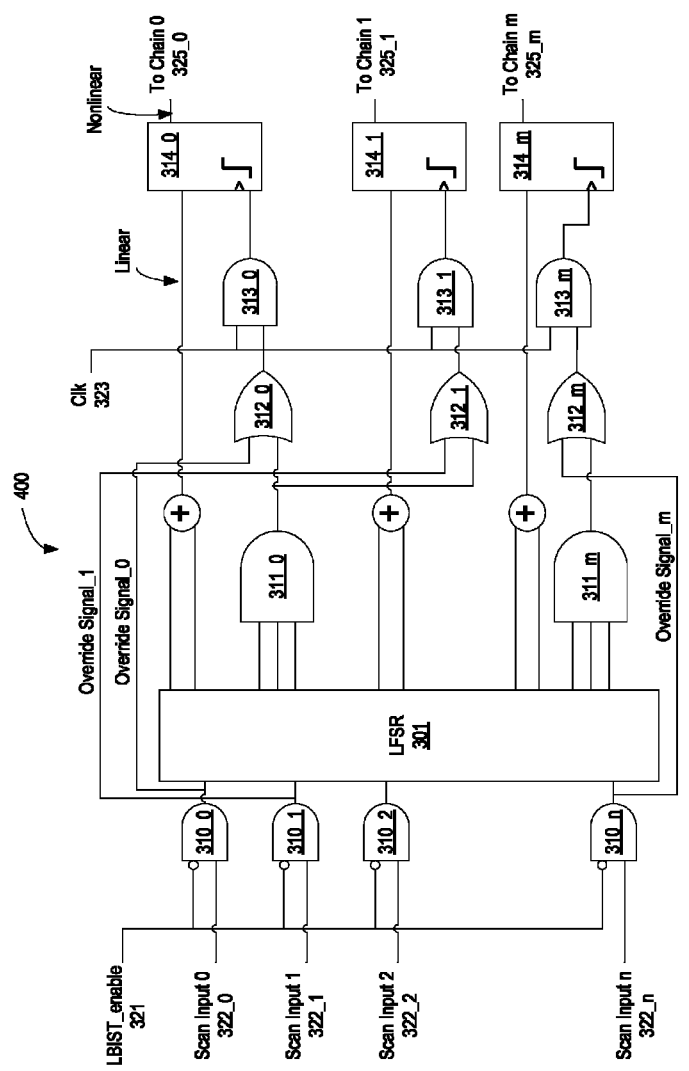
FIG. 4 illustrates an exemplary decompressor with different scan-inputs used to bypass the random clock gating to the pipeline feeding to different sets of outputs of a spreader network, according to one embodiment.

FIG. 3a illustrates an exemplary sequential decompressor with a final output pipeline stage within a spreader network, according to one embodiment. The clock Clk 323 to the pipeline stage element 314 is gated by AND gates 311 that provide a non-linear function of the LFSR output. The LFSR outputs are overridden by a master override signal provided by scan-input signal 310_0. The scan-inputs are ignored when the LBIST_enable is asserted. Diagram 300a shows how the decompressor randomly gates the pipeline clock Clk 323 and updates a final pipeline stage within spreader network 105 prior to feeding values to scan chains 325, with one of the scan-inputs forcing the clock to update the pipeline (as a master clock gate override). In this and following diagrams, it is indicated where there are linear functions (input to pipeline stage) and non-linear functions (output of pipeline stage and the clock signals to the pipeline stage) of scan-in stream data variables.

The clock going to the pipeline stage is gated by a logic fed from LFSR 301. The clock is weighted such that the chance of the clock enable is lower than the 100% than it would otherwise be. If the clock is gated using a single LFSR output, (assuming the LFSR output is randomly 0 or 1) the pipeline stage has a 50% chance of being clocked on a shift cycle. If two LFSR outputs are ANDed together to gate the clock, the probability of the pipeline stage being clocked is reduced to 25%. Each additional LFSR output that is ANDed together reduces the chance of the pipeline stage being clocked by another factor of 2.

AND gates 310 feeding LFSR 301 are used only when the same logic is used for both LBIST and test compression. If only LBIST is applied, scan-input pins 322 do not feed to LFSR 301 and no AND gates 310 are used to feed LFSR 301. If only test compression is applied, scan-input pins 322 feed LFSR 301 by directly XORing into some bits without AND gates 310. The circles with plus signs (+) represent XOR logic that is a part of spreader network 105. In this example, chains 0 and 1 share a common gated clock while other chains share other gated clocks that use different gating logic that may be enabled under different conditions from the LFSR bits. Scan-in 0 when used for test decompression provides a master override to all clock gating such that when scan-in 0 is at a logic value 1, all final pipeline stages are clocked.

Figure 3B:
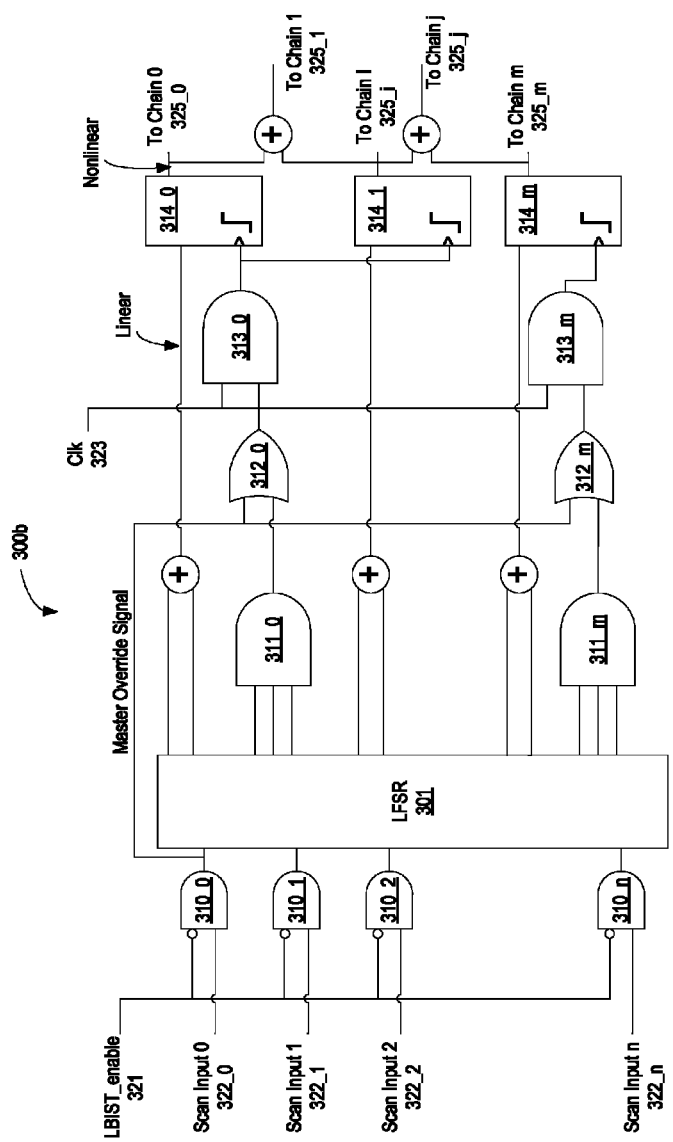
FIG. 3b illustrates an exemplary sequential decompressor with the final output pipeline stage followed by some additional linear (XOR) spreader function, according to another embodiment.

FIG. 3b illustrates an exemplary sequential decompressor useful for LBIST or test compression with the final output pipeline stage followed by some additional linear (XOR) spreader function, according to another embodiment. Some of the XOR logic for spreader network 105 are placed past the final pipeline stage. The clock is randomly gated to update the pipeline stage within spreader network 105 prior to feeding values to the scan chains 325 with some of the spreader network linear (XOR) function between the pipeline last stage and the channel inputs.

FIG. 4 illustrates an exemplary decompressor with different scan-inputs used to bypass the random clock gating to the pipeline feeding to different sets of outputs of a spreader network, according to one embodiment. In this example, each scan-input pin 322 is used to override a different set of clock gates. However, it is appreciated that one or a selected number of scan-input pins 322 can be used to override all clock gates without deviating from the scope of the present subject matter.

Figure 5:
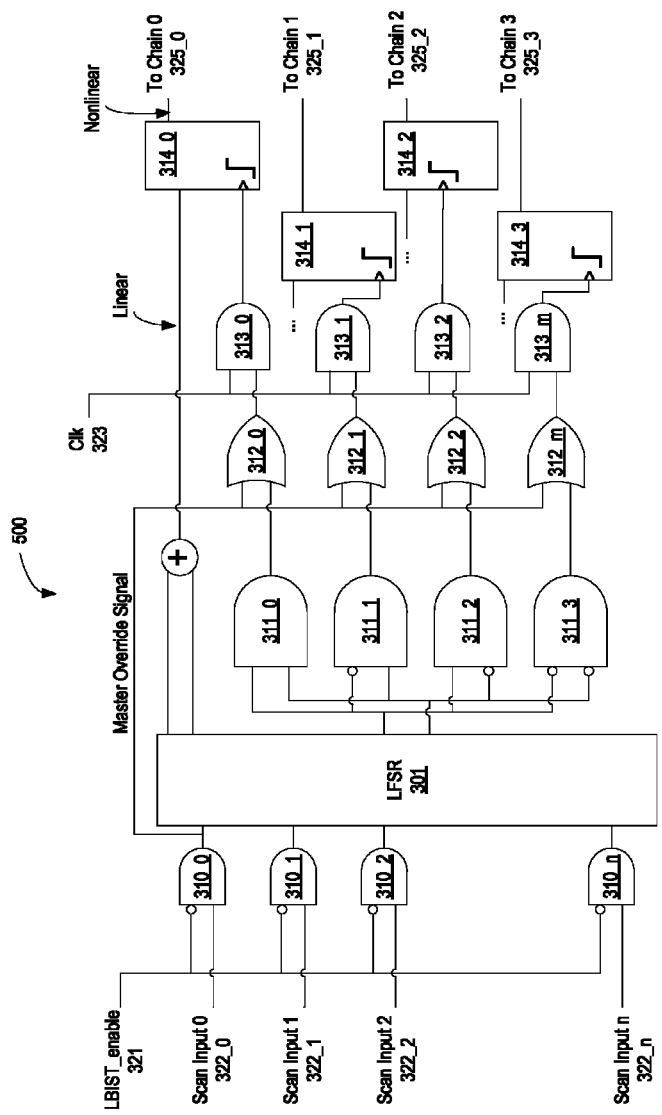
FIG. 5 illustrates an exemplary decompressor with mutually exclusive decoding used to perform clock gating to the pipeline of a spreader network, according to one embodiment.

FIG. 5 illustrates an exemplary decompressor with mutually exclusive decoding used to perform clock gating to the pipeline of a spreader network, according to one embodiment. Only one of the mutually exclusive decodes of a set (311_0, 311_1, 311_2, and 311_3) allows the clock to get through without being overridden on any one shift cycle. The clock gating logic decodes some LFSR outputs and ensures through mutually exclusive decoding that only one of the decoded set enables the clock to get through. In this example, two LFSR outputs are decoded to allow only one out of four pipeline stages to update. If three LFSR outputs are decoded, one out of 8 pipeline stages is clocked unless overridden by a scan-in clock gate override.

Figure 6A:
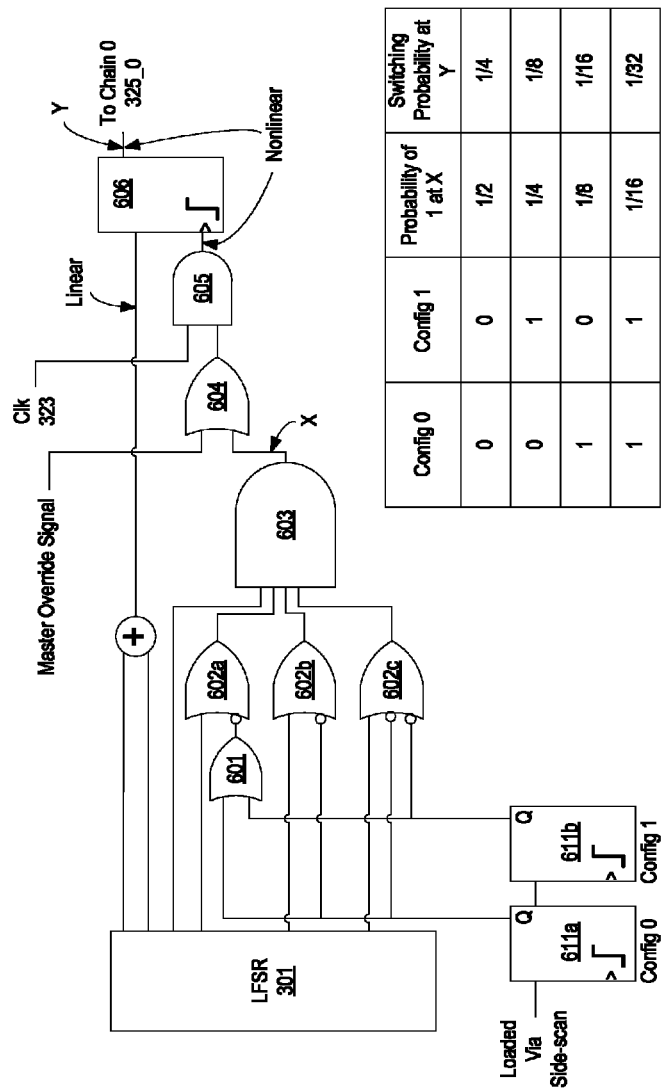
FIG. 6a illustrates an exemplary decompressor with a programmable number of random inputs ANDed together to gate the clock, according to one embodiment.

FIG. 6a illustrates an exemplary decompressor with a programmable number of random inputs ANDed together to gate the pipeline clock Clk 323, according to one embodiment. The random inputs are used to perform the random clock gating to the pipeline of spreader network 105. The programmable clock gate weighting logic determines how many LFSR outputs are used to weight the clock gate. The more LFSR outputs used, the lower the probability the clock is enabled given random data in LFSR 301. This shows that the programming for just one of potentially many clock gating mechanisms within the reduced switching spreader network 105, allowing the pipeline clock's probability of updating the last pipeline stage is adjusted (independently for clock gates that use different clock gate program control bits). In the present example, four LFSR outputs are used, and the pipeline's clock probability of being enabled at the output of AND gate 603 is programmable from ½ down to 1/16.

Figure 6B:
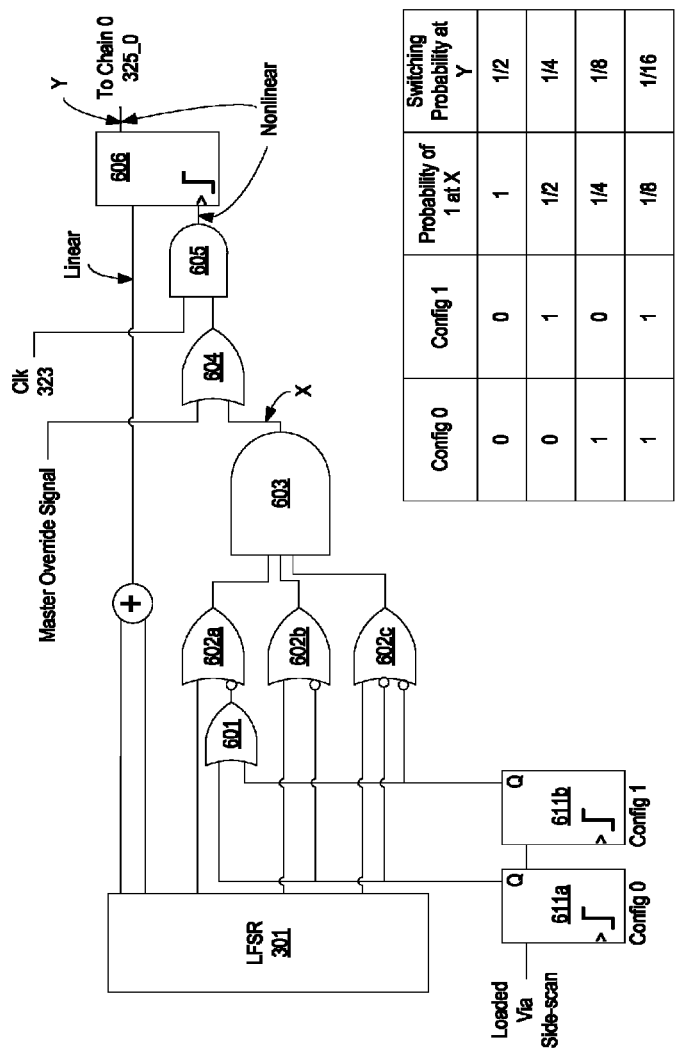
FIG. 6b illustrates another exemplary decompressor with a programmable number of random inputs ANDed together to gate the clock, according to one embodiment.

FIG. 6b illustrates a slightly different clock gating mechanism that adjusts the clock gating weight from 0 to 3 LFSR bits ANDed. In the present example, three LFSR outputs are used, and the pipeline's clock probability of being enabled at the output of AND gate 603 is programmable from 1 down to ⅛. When 0 bits are selected, there is no clock gating and the pipeline stages affected by such programming are always updated.

FIG. 7 illustrates an exemplary clock gating mechanism using a counter, according to one embodiment. Counter 710 continually cycles and updates the clock gate latch value every time it gets to all zeros. The clock gating value is held constant until the counter signals to update the clock gate value. The clock gate latches' values are controlled and maintained for all clock gates by counter 710 for the number of cycles covered by counter 710. For example, a 4 bit counter updates all clock gate latch values every 16 cycles and if the clock is enabled for some spreader pipeline stages, they update on each of the next 16 shift cycles; if the clock is disabled, they repeat the same data for the next 16 shift cycles unless overridden by a scan-in override.

Counter 710 is used to maintain a clock gating setting for several consecutive shift cycles. This helps when care bits are located within several consecutive scan cycles of the same chain, which commonly occurs during ATPG tests. By enabling the clock gate on a cycle in which counter 710 enables the update of the clock gate latch, the clock to the pipeline is enabled for several consecutive cycles, based on the size of counter 710. Using a 4 bit counter, the clock gating value is set for 16 consecutive cycles at a time, reducing the amount of bandwidth consumed to set up clock gating or enabling, thus reducing the clock gating overhead so the ATPG is focused on providing the data values for the scan chains 325 with care bit requirements over those cycles.

FIG. 8 illustrates an exemplary decompressor with a single scan input used as a master clock gate override and linearly combined scan-inputs used to override individual clock gates, according to one embodiment. In this example, scan input 0 (322_0) is used as a master override signal, and different override signals are derived from programmable linear combinations of scan-input pin values to override different clock gate signals. The programmability for override signals is beneficial in helping to solve for clock gating conditions as well as spreader output values for specific scan cycles.

When scan-input pins are used to provide overrides for clock gates, for scan cycles where no care bit data needs to be specified on the scan-input pins, the scan-input pins are held to all zeros such that the clock gates are not overridden. This enables the pure weighted random clock gating to ensure a sufficiently low amount of scan data switching, but not too low to impact the quality of the test. Any scan-input pin used for overriding a clock gate tends to be set to a value for not overriding the clock gating when given a choice. In this example, a value of 0 is appropriate for not overriding the weighted random clock gating.

FIG. 9 illustrates an exemplary decompressor pipelining data with a weight select signal, according to one embodiment. Decompressor 900 is useful during LBIST test modes, allowing both flat random and weighted random data to be clocked into the spreader pipeline stage. In this embodiment, flat random or weighted random binary values are selected based on the setting of "weight select" control. The weight select control may be independently set for different sets of chains. The weight scheme is useful for testing some logic in designs where more 0 values help or more 1 values help. Such weighting schemes are more appropriate for LBIST than test decompression.

FIG. 10 illustrates an exemplary implementation for an LFSR for both LBIST and test decompression, according to one embodiment. In a preferred embodiment, the k-bits between points where the scan-input pin data is XORed into LFSR 301 are relatively evenly distributed. Although $k_0$ through $k_j$ may be different numbers, the number of LFSR bits between where scan-inputs are XORed into the LFSR are preferred to be the same or close to the same value to fairly evenly divide the number of bits in LFSR 301 by the number of scan-input pins when loading data into LFSR 301. Not shown in FIG. 10 is the LBIST enable signal, whose inverted value is ANDed with the scan-input pin signals prior to being XORed into the midst of LFSR 301 if both LBIST and decompression modes are to be supported.

A given set of logic gates the clocks to a final stage of pipeline within spreader network 105, with a capability of being overridden using combinational logic from one or more scan-input pins. For each final pipeline stage, 1) the logical equation for enabling the clock to the final pipeline stage is known, and 2) the logical equation for the data feeding into each final pipeline stage is known. In cases where XOR gates are used past the final pipeline stage for the spreader network, equations for each chain input are defined as an XOR function of one or more final pipeline stages of spreader network 105.

When a value is requested to be fed to a chain input on a specific shift cycle, if the value in the pipeline stages at that point does not yield the desired value to the chain, one or more of the final pipeline stage elements feeding that chain update in the prior shift cycle so as to provide the desired value at that chain input on the desired cycle. When a single pipeline stage element feeds the chain input, the pipeline stage element has its clock enabled on a prior shift cycle in which the pipeline stage is not used for obtaining a prior care bit for this same chain or any other chain that it feeds to. When more than one pipeline elements feed to the chain input, such as is shown in FIG. 3b, an odd number of pipeline stage elements changes the value. In one embodiment, all but one pipeline stage element feeding the chain input gates the clock off and one of them updates its value while ensuring that the data input to the updating pipeline element is set to the right value on the input to the chain for the next shift cycle. If this try fails, one of the other pipeline elements feeding the chain is serially tried to obtain the desired value.

Getting the clock to the pipeline element enabled is done by either getting all inputs to the gate set to the non-controlling value (1 in the case of an AND gate, 0 in the case of a NOR gate). Each bit in LFSR 301 that feeds to the (AND or NOR) gate input is set to a value (of 1 or 0 respectively) as a linear function of scan-input pin stream values (looked at as vector variables for each scan-input pin and for each shift cycle) and any constants that have been set by processing of earlier shift cycles. This is considered to be a non-linear equation (e.g., the ANDing of several linear equations to make a new, non-linear equation) for the clock enable signal for the pipeline element. If the clock gating signal is latched and the clock to said latch is supplied by the clock gated by a counter output, the way to obtain the clock enable signal value is not changed, but it does influence the cycle on which the clock enable signal is obtained to the desired value. For example, when using a 4 bit counter, the clock enable signal to the pipeline element is sampled only once every 16 clock cycles, so that the desired clock enable values are preloaded at the nearest cycle ahead of the cycle, in which the counter updates the latching of the clock enable signal.

If the clock gating logic uses a programmable number of LFSR inputs that are ANDed or NORed together to create the pipeline clock enable, the chains that have more than a handful of care bits for a test are identified and their clock gate logic is programmed to use fewer LFSR bits for gating the clocks for those chains. In one embodiment, no LFSR bit is programmed for the clock gating so that the pipeline clock Clk 323 always gets through for the chains with the most care bits associated with them. In another embodiment, a single LFSR bit is used to gate the pipeline clock Clk 323 for those chains with the majority of care bits for the test. One exception is that any chain that contains more than 50% care bits with changing values so that the pipeline clock needs to gets through more than 30% of the time for that chain on the test, the clock gating is programmed to be disabled for the pipeline stage feeding that chain so the clock will get through on 100% of the shift cycles.

LFSR 301 is reset and cycled through some number of initial cycles to prime it with data from the scan-input pin streams that help obtain values for care bits located at the end of the longer scan chains. The pipeline clock Clk 323 is forced enabled during an early one of these priming cycles to ensure the pipeline does not contain values left over from a previous test. All data shifting into the chains after these first few priming cycles determine the values to end up in the scan chains. The earlier cycles past the initialization provide values that end up in bits furthest away from the scan chain inputs, and the last few cycles provide values that end up in the scan chain bits fed directly by the outputs of spreader network 105. The very last shift cycle applied gets values already in the spreader network pipeline for shifting into the chains and the LFSR state and scan-inputs have no effect on that last bit loaded into the chains. The values so appearing at the spreader outputs on these shift cycles are determined by a set of non-linear equations for the pipeline clock gating and linear equations for the data value coming through the pipeline stages. These are the equations that reference values within the LFSR bits or the override for the clock gating coming directly from scan-input pins. The LFSR bits are determined by a linear combination of other LFSR bits and scan-input pin stream values, based on the LFSR feedback function and where the scan-input pins are XORed into LFSR bit positions. This creates a recurrence relation; when applied recursively, new and linear equations are defined for each bit of LFSR 301 as a linear function of scan-input pin variables. These equations take on new scan-input pin variables and grow in the number of scan-input pin variables as the shift cycle number increases. To get a specific value into one or more LFSR bits on any shift cycle, a set of linear equations are solved for those bits using a standard approach (e.g., Gaussian elimination) for solving simultaneous linear equations. Thus, when determining how to enable the clock and set the pipeline data to a specific value, the linear equations of LFSR bits for the clock gate data are ANDed or NORed, creating a set of non-linear equations; these non-linear equations are solved by resolving all LFSR bits to provide the non-controlling value at the clock gate (1 for AND and 0 for NOR) and this is solved simultaneously with the data.

Although it is theoretically feasible to assign non-linear equations to each scan bit of each scan chain based on the non-linear functions of the scan-input pin stream values that appear at the spreader network outputs, the length and sizes of these equations quickly grow after a few shift cycles because of the non-linear aspect caused by the clock gating of the spreader network pipeline. Therefore, it would be impractical when processing any modern sized circuit design to assign non-linear equations to each scan chain bit position. In order to keep the size of the equations down to a meaningful size, each shift cycle that delivers care bits into a set of one or more chains is examined in the order of earliest scan cycle to the last scan cycle—paying attention primarily to those shift cycles that include one or more care bits being loaded into the chains.

The care bits are loaded into the chains by loading the pipeline stages that feed the spreader outputs to the desired values on a prior shift cycle, including use of the earliest first few cycles used to prime LFSR 301 and the pipeline. The final pipeline stage elements are required to contain the desired values for the current cycle; it is the ATPG's job to ensure that they have been loaded prior to the current cycle. With the possibility of clock gating to the final pipeline stage, the final pipeline elements may be loaded on the very preceding cycle, or any cycle prior to the current cycle that does not conflict with the care bit loading requirements of those cycles.

By working at loading care bits starting from the earliest shift cycle and proceeding to successively later shift cycles, the pipeline final stage elements often already have the desired value, and only when they do not, their values need to be changed; when they do contain the desired values, it is ensured that they do not get clocked on the preceding cycle(s) or that if they do get clocked, the value loaded into them matches their current value. When solving the equations to get the desired values on the clock gate inputs and/or pipeline stage inputs, there are typically multiple choices for how to obtain the correct output state of spreader network 105 for that shift cycle. The information regarding decisions for how the values got out of spreader network 105 is saved so that, if a later shift cycle fails to obtain its values due to an earlier shift cycles' decision, the prior decision is traced back and a different way is tried to obtain the desired care bit values out of spreader network 105. According to one embodiment, the depth of the search that can be backed out of to try another possible solution is bounded by a limit on the number of scan cycles to solve in one pass. Solving all scan cycles requires multiple passes working on continually later sets of shift cycles that contain care bits required by ATPG. A typical limit might be 32 scan cycles maximum to be solved in a single pass. For a design utilizing a total of 512 scan cycles, it would take 16 passes of 32 scan cycles each to complete all 512 scan cycles.

Once a shift cycle is resolved for how to get the required care bit values out of spreader network 105, the values for certain scan-input pin stream variables are set so that some of the LFSR bits and pipeline stage bits are at known values to obtain the care bits on that cycle. Some scan-input pin variables remain unspecified up to that shift cycle and some pipeline stages may be left with equations rather than variables for their contents if they are don't care bits to that point.

At any time, if the spreader output and pipeline elements feeding a chain have known values, it is possible to look ahead for when that chain has another care bit defined for it on a future shift cycle. If there is another care bit needed for the same chain within a few shift cycles, and the value is the same as being output on this spreader output a few cycles earlier, it is desired to try to avoid clocking the pipeline elements by utilizing clock gating to them. This may require setting an LFSR bit to the controlling value of the clock gate and there remain multiple choices as for which LFSR bit to use on each shift cycle. When an LFSR bit that shifts on to feed another input of the same clock gate is chosen without going through a point in the LFSR where a scan-input pin is XORed in, the LFSR bit is set in one cycle and is counted on to hold the clock off for the next cycle as well. This is advantageous for tapping LFSR bits to feed clock gates that are consecutive within LFSR 301 and do not have scan-input pins XORed between them. This is not a requirement, but is advantageous if so implemented. It is noted that any scan-input pins that can be used as clock gate overrides to the clock gate being used are held such that they do not override the clock gate. In the end if keeping the pipeline clock gated off for a few cycles cannot be done, the pipeline stages are re-loaded at least by the cycle prior to the values next being needed.

Although it may be possible to solve each scan cycle one at a time from the earliest scan cycle to the last scan cycle containing care-bits, efficiency is gained by examining 2 or more consecutive scan cycles for resolving care-bits from the LFSR bits and their linear function of scan-in stream bit values. In many cases when solving care bits on any given scan cycle, there are several ways to output the requested care bit values to the chains. When there are multiple choices, a choice is selected and it is remembered that there was at least one other solution. When solving a future scan cycle, a different solution may be tried to see if that solves the future scan cycle. The saving of decisions on a decision stack allows the possibility to backtrack to prior decisions, which is a known technique in which a solution space can be searched for a valid solution. To avoid the decision stack getting too large and making for a long-running process, the number of scan cycles that are solved together is arbitrarily limited. The limit may be from 1 cycle to all cycles, but a practical limit may be 32 or fewer scan cycles. Scan cycles with very few care-bits are the easiest to solve and they provide a possible break point when looking for how many cycles to solve together. For example, if the next several scan cycles have the following number of care bits each: 1, 3, 5, 2, and 1, it may be most appropriate to solve the first 4 cycles together and then start up again on the $5^{th}$ cycle that has only 1 care bit required. Scan cycles that have very few care bits required (0, 1 or 2) are easier to solve even if all prior scan cycles specify nearly all previous scan-input pin values, because they typically require only 0, 1 or 2 scan-input pin values to be solved. If there are no scan cycles with very few care bits found, a hard limit of 32 scan cycles may be appropriate to use as the maximum number of cycles to solve for together in a single pass. Alternatively, the ATPG can avoid creating tests that have more than 32 consecutive cycles with more than 1 or 2 care.

A method and system for providing reduced scan switching in LBIST and sequential test decompression test applications is disclosed. Although various embodiments have been described with respect to specific examples and subsystems, it will be apparent to those of ordinary skill in the art that the concepts disclosed herein are not limited to these specific examples or subsystems but extends to other embodiments as well. Included within the scope of these concepts are all of these other embodiments as specified in the claims that follow.

We claim:

1. A method for reducing switching activity of a spreader network during a scan-load operation for feeding a plurality of scan chains, the method comprising:
   receiving a plurality of scan input signals from a tester;
   updating bits in a linear feedback shift register using the plurality of scan input signals, each bit of the linear feedback shift register being shifted at each shift cycle for a plurality of shift cycles;
   providing a nonlinear gating signal using a combination of a first set of outputs of the linear feedback shift register;
   providing a data value using a combination of a second set of outputs of the linear feedback shift register to a pipeline element, wherein the combination of the second set of outputs is performed by one or more logic gates;
   gating a pipeline clock provided to the pipeline element using the nonlinear gating signal; and
   feeding the data value from the pipeline element to a scan chain of the plurality of scan chains based on the gated pipeline clock.

2. The method of claim 1, wherein the scan-load operation is configured for a logic built-in self test (LBIST) or an on-chip test decompression.

3. The method of claim 1, wherein at least two outputs from the linear feedback shift registers are XORed to provide the data value.

4. The method of claim 1 further comprising:
   overriding gating the pipeline clock to the pipeline element using at least one scan input signal of the plurality of scan input signals.

5. The method of claim 1, wherein the at least one scan input signal of the plurality of scan input signals is used to bypass the pipeline clock.

6. The method of claim 1, wherein a mutually exclusive decoding is used to gate the pipeline clock to the pipeline stage.

7. The method of claim 1, wherein the outputs from the linear feedback shift register are programmable to provide the nonlinear gating signal.

8. The method of claim 1, wherein the pipeline clock is gated by a latched value of the nonlinear gating signal and said latch is updated using a counter.

9. The method of claim 1 further comprising:
deriving an override signal from a linear combination of the scan input signals.

10. The method of claim 1, wherein the pipeline element is provided with a weight select signal and wherein the weight select signal controllably adjust the weight of the data value.

11. A non-transitory computer-readable medium for reducing switching activity during a scan-load operation for feeding a plurality of scan chains having stored thereon a plurality of instructions, said plurality of instructions when executed by a computer, cause said computer to perform:
receiving a plurality of scan input signals from a tester;
updating bits in a linear feedback shift register using the plurality of scan input signals, each bit of the linear feedback shift register being shifted at each shift cycle for a plurality of shift cycles;
providing a nonlinear gating signal using a combination of a first set of outputs of the linear feedback shift register;
providing a data value using a combination of a second set of outputs of the linear feedback shift register to a pipeline element, wherein the combination of the second set of outputs is performed by one or more logic gates;
gating a pipeline clock provided to the pipeline element using the nonlinear gating signal; and
feeding the data value from the pipeline element to a scan chain of the plurality of scan chains based on the gated pipeline clock.

12. The non-transitory computer-readable medium of claim 11, wherein the scan-load operation is configured for a logic built-in self test (LBIST) or an on-chip test decompression.

13. The non-transitory computer-readable medium of claim 11, wherein at least two outputs from the linear feedback shift register are XORed to provide the data value.

14. The non-transitory computer-readable medium of claim 11 having stored thereon a plurality of instructions, said plurality of instructions when executed by a computer, cause said computer to further perform:
overriding gating the pipeline clock to the pipeline element using at least one scan input signal of the plurality of scan input signals.

15. The non-transitory computer-readable medium of claim 11, wherein at least one scan input signal of the plurality of scan input signals is used to bypass the pipeline clock.

16. The non-transitory computer-readable medium of claim 11, wherein a mutually exclusive decoding is used to gate the pipeline clock to the pipeline stage.

17. The non-transitory computer-readable medium of claim 11, the outputs from the linear feedback shift register are programmable to provide the nonlinear gating signal.

18. The non-transitory computer-readable medium of claim 11, wherein the pipeline clock is gated by a latched value of the nonlinear gating signal and said latch is updated using a counter.

19. The non-transitory computer-readable medium of claim 11 having stored thereon a plurality of instructions, said plurality of instructions when executed by a computer, cause said computer to further perform:
deriving an override signal from a linear combination of the scan input signals.

20. The non-transitory computer-readable medium of claim 11, wherein the pipeline element is provided with a weight select signal and wherein the weight select signal controllably adjust the weight of the data input.

21. The non-transitory computer-readable medium of claim 11 having stored thereon a plurality of instructions, said plurality of instructions when executed by a computer, cause said computer to further perform;
solving linear equations for the bits in the linear feedback shift using the second set of outputs of the linear feedback shift register; and
solving nonlinear equations for the nonlinear gating signal using the first set of outputs of the linear feedback shift register.

22. The non-transitory computer-readable medium of claim 21, wherein the solving linear equations is done one scan cycle at a time.

23. The non-transitory computer-readable medium of claim 21, wherein the solving linear equations is done by solving several scan cycles at a time, using a standard backtracking mechanism.

24. A sequential decompressor feeding a plurality of scan chains by providing reduced switching activity during a scan-load operation, the sequential decompressor comprising:
a pipeline stage;
a linear feedback shift register configured to receive a plurality of scan input signals from a tester, and provide a plurality of LFSR outputs, wherein the linear feedback shift register is configured to be updated using the plurality of scan input signals and each bit of the linear feedback shift register is configured to be shifted at each shift cycle of a plurality of shift cycles;
a spreading network that includes at least the pipeline stage prior to feeding into the plurality of scan chains; and
a clock gate configured to receive a pipeline clock, to receive a nonlinear gating signal comprising a combination of the plurality of LFSR outputs, and to transmit an output to the pipeline stage, wherein the nonlinear gating signal is used to gate the pipeline clock after the linear feedback shift register is updated, and wherein the spreader network feeds the plurality of scan chains after the final pipeline stage.

* * * * *